United States Patent
Rice et al.

(10) Patent No.: US 11,894,257 B2
(45) Date of Patent: Feb. 6, 2024

(54) SINGLE WAFER PROCESSING ENVIRONMENTS WITH SPATIAL SEPARATION

(71) Applicant: Applied Materials, Inc., Santa Clara, CA (US)

(72) Inventors: Michael Rice, Pleasanton, CA (US); Joseph AuBuchon, San Jose, CA (US); Sanjeev Baluja, Campbell, CA (US); Mandyam Sriram, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 768 days.

(21) Appl. No.: 16/171,785

(22) Filed: Oct. 26, 2018

(65) Prior Publication Data

US 2019/0131167 A1    May 2, 2019

Related U.S. Application Data

(60) Provisional application No. 62/578,365, filed on Oct. 27, 2017.

(51) Int. Cl.
H01L 21/68      (2006.01)
H01L 21/687     (2006.01)
(Continued)

(52) U.S. Cl.
CPC .... *H01L 21/68785* (2013.01); *C23C 16/4409* (2013.01); *C23C 16/4584* (2013.01); *C23C 16/45525* (2013.01); *C23C 16/46* (2013.01); *H01L 21/6719* (2013.01); *H01L 21/67103* (2013.01); *H01L 21/67248* (2013.01);
(Continued)

(58) Field of Classification Search
CPC ......... H01L 21/68785; H01L 21/68764; H01L 21/68771
See application file for complete search history.

(56) References Cited

U.S. PATENT DOCUMENTS 4,987,856 A * 1/1991 Hey ..................... C23C 16/455
                                                    118/715
5,083,896 A    1/1992 Uehara et al.
(Continued)

FOREIGN PATENT DOCUMENTS

CN      106133874 A     11/2016
JP      2008190046 A     8/2008
(Continued)

OTHER PUBLICATIONS

PCT International Search Report and Written Opinion in PCT/US2018/057685 dated Mar. 11, 2019, 13 pages.
(Continued)

*Primary Examiner* — Keath T Chen
(74) *Attorney, Agent, or Firm* — Servilla Whitney LLC

(57) ABSTRACT

Apparatus and methods to process one or more wafers are described. A plurality of process stations are arranged in a circular configuration around a rotational axis. A support assembly with a rotatable center base defining a rotational axis, at least two support arms extending from the center base and heaters on each of the support arms is positioned adjacent the processing stations so that the heaters can be moved amongst the various process stations to perform one or more process condition.

17 Claims, 14 Drawing Sheets

(51) Int. Cl.
*C23C 16/44* (2006.01)
*C23C 16/458* (2006.01)
*H01L 21/67* (2006.01)
*C23C 16/46* (2006.01)
*H01L 21/683* (2006.01)
*C23C 16/455* (2006.01)

(52) U.S. Cl.
CPC ...... *H01L 21/6831* (2013.01); *H01L 21/6833* (2013.01); *H01L 21/68764* (2013.01); *H01L 21/68771* (2013.01)

(56) References Cited

U.S. PATENT DOCUMENTS

| | | | |
|---|---|---|---|
| 5,133,284 A * | 7/1992 | Thomas | C23C 16/45521 118/719 |
| 5,951,772 A * | 9/1999 | Matsuse | C23C 8/06 118/723 R |
| 6,319,553 B1 | 11/2001 | McInerney et al. | |
| 6,485,250 B2 | 11/2002 | Hofmeister | |
| 6,486,444 B1 | 11/2002 | Fairbairn et al. | |
| 6,764,658 B2 | 7/2004 | Denes et al. | |
| 7,179,044 B2 | 2/2007 | Cameron et al. | |
| 7,458,763 B2 | 12/2008 | Van Der Meulen | |
| 7,682,454 B2 | 3/2010 | Sneh | |
| 8,033,769 B2 | 10/2011 | Gage et al. | |
| 8,344,559 B2 | 1/2013 | Van Zyl et al. | |
| 8,616,820 B2 | 12/2013 | Kurita et al. | |
| 8,992,725 B2 | 3/2015 | Godyak | |
| 9,091,397 B2 | 7/2015 | Shareef et al. | |
| 9,287,096 B2 | 3/2016 | Marakhtanov et al. | |
| 9,325,228 B2 | 4/2016 | Hudgens et al. | |
| 9,378,992 B2 | 6/2016 | Huseinovic et al. | |
| 9,447,498 B2 | 9/2016 | Shiba | |
| 9,484,233 B2 | 11/2016 | Leeser | |
| 9,589,822 B2 | 3/2017 | Shindo | |
| 9,623,555 B2 | 4/2017 | Krupyshev et al. | |
| 2001/0007244 A1 | 7/2001 | Matsuse | |
| 2003/0213560 A1 | 11/2003 | Wang et al. | |
| 2004/0228712 A1 | 11/2004 | Nam et al. | |
| 2005/0084610 A1 | 4/2005 | Selitser | |
| 2007/0215036 A1 | 9/2007 | Park et al. | |
| 2007/0218701 A1 | 9/2007 | Shimizu et al. | |
| 2007/0218702 A1 | 9/2007 | Shimizu et al. | |
| 2009/0016853 A1 | 1/2009 | Yoo | |
| 2009/0214786 A1 | 8/2009 | Chang et al. | |
| 2009/0301653 A1 | 12/2009 | Lee | |
| 2009/0320948 A1 | 12/2009 | Asanuma et al. | |
| 2011/0017127 A1 * | 1/2011 | von Kanel | C23C 16/507 117/97 |
| 2011/0120375 A1 | 5/2011 | Song et al. | |
| 2011/0250044 A1 | 10/2011 | Obweger et al. | |
| 2011/0290175 A1 | 12/2011 | Paranjpe et al. | |
| 2012/0094011 A1 | 4/2012 | Hishiya et al. | |
| 2012/0225195 A1 | 9/2012 | Yudovsky | |
| 2013/0118407 A1 * | 5/2013 | Park | C23C 16/45565 118/725 |
| 2015/0194298 A1 | 7/2015 | Lei et al. | |
| 2015/0332912 A1 | 11/2015 | Nowak et al. | |
| 2015/0361553 A1 * | 12/2015 | Murakawa | C23C 16/52 156/345.55 |
| 2016/0177444 A1 | 6/2016 | Baldasseroni et al. | |
| 2016/0215392 A1 | 7/2016 | Yudovsky et al. | |
| 2016/0217999 A1 | 7/2016 | Sato et al. | |
| 2016/0218028 A1 | 7/2016 | Schaller et al. | |
| 2016/0355927 A1 * | 12/2016 | Weaver | H01L 21/68771 |
| 2017/0029947 A1 | 2/2017 | Kawahara et al. | |
| 2017/0029948 A1 | 2/2017 | Jongbloed et al. | |
| 2017/0032956 A1 * | 2/2017 | Kawahara | C23C 16/04 |
| 2017/0081764 A1 | 3/2017 | Aburatani et al. | |
| 2017/0092531 A1 * | 3/2017 | Coomer | H01L 21/68742 |
| 2017/0117172 A1 | 4/2017 | Genetti et al. | |
| 2017/0218514 A1 | 8/2017 | Kato et al. | |
| 2017/0314132 A1 | 11/2017 | Kim et al. | |
| 2017/0314133 A1 | 11/2017 | Kim et al. | |

FOREIGN PATENT DOCUMENTS

| | | |
|---|---|---|
| JP | 2010084192 A | 4/2010 |
| JP | 2011187695 A | 9/2011 |
| JP | 2017139449 A | 8/2017 |
| KR | 20090125610 A | 12/2009 |
| KR | 1020130106906 A | 10/2013 |
| WO | 2006088463 A1 | 8/2006 |
| WO | 2016040448 A1 | 3/2016 |
| WO | 2017019249 A1 | 2/2017 |
| WO | 2017019250 A1 | 2/2017 |

OTHER PUBLICATIONS

PCT International Search Report and Written Opinion in PCT/US2019/058248 dated Feb. 19, 2020, 13 pages.
Machine Translation of JP2011187695, 11 pages.
Machine Translation of KR1020090125610, 10 pages.

* cited by examiner

_US 11,894,257 B2_

SINGLE WAFER PROCESSING ENVIRONMENTS WITH SPATIAL SEPARATION

CROSS-REFERENCE TO RELATED APPLICATIONS

This application claims priority to U.S. Provisional Application No. 62/578,365, filed Oct. 27, 2017, the entire disclosure of which is hereby incorporated by reference herein.

TECHNICAL FIELD

The present disclosure relates generally to apparatus for depositing thin films. In particular, the disclosure relates to apparatus having a plurality of movable heating wafer supports and spatially separated processing stations.

BACKGROUND

Current atomic layer deposition (ALD) processes have a number of potential issues and difficulties. Many ALD chemistries (e.g., precursors and reactants) are "incompatible", which means that the chemistries cannot be mixed together. If the incompatible chemistries mix, a chemical vapor deposition (CVD) process, instead of the ALD process could occur. The CVD process generally has less thickness control than the ALD process and/or can result in the creation of gas phase particles which can cause defects in the resultant device. For a traditional time-domain ALD process in which a single reactive gas is flowed into the processing chamber at a time, a long purge/pump out time occurs so that the chemistries are not mixed in the gas phase. A spatial ALD chamber can move one or more wafer(s) from one environment to a second environment faster than a time-domain ALD chamber can pump/purge, resulting in higher throughput.

The semiconductor industry requires high quality films which can be deposited at lower temperatures (e.g., below 350° C.). To deposit high quality films at temperatures below where the film would be deposited with a thermal only process, alternative energy sources are needed. Plasma solutions can be used to provide the additional energy in the form of ions and radicals to the ALD film. The challenge is to get sufficient energy on the vertical side wall ALD film. Ions typically are accelerated through a sheath above the wafer surface in a direction normal to the wafer surface. Therefore, the ions provide energy to horizontal ALD film surfaces, but provide an insufficient amount of energy to the vertical surfaces because the ions moving parallel to the vertical surfaces.

Some process chambers incorporate a capacitively coupled plasma (CCP). A CCP is created between a top electrode and the wafer, which is commonly known as CCP parallel plate plasma. A CCP parallel plate plasma generates very high ion energies across the two sheeths and, therefore, do a very poor job on the vertical side wall surfaces. By spacially moving a wafer to an environment optimized for creating high radical flux and ions flux with lower energies and wider angular distribution to the wafer surface, better vertical ALD film properties can be achieved. Such plasma sources include microwave, inductively coupled plasma (ICP), or higher frequency CCP solutions with 3rd electrodes (i.e., the plasma is created between two electrodes above the wafer and not using the wafer as a primary electrode).

Current spatial ALD processing chambers rotate a plurality of wafers on a heated circular platen at a constant speed which moves the wafers from one processing environment to an adjacent environment. The different processing environments create a separation of the incompatible gases. However, current spatial ALD processing chambers do not enable the plasma environment to be optimized for plasma exposure, resulting in non-uniformity, plasma damage and/or processing flexibility issues.

For example, the process gases flow across the wafer surface. Because the wafer is rotating about an offset axis, the leading edge and trailing edge of the wafer have different flow streamlines. Additionally, there is also a flow difference between the inner diameter edge and outer diameter edge of the wafer caused by the slower velocity at the inner edge and faster at the outer edge. These flow non-uniformities can be optimized but not eliminated. Plasma damage can be created when exposing a wafer to non-uniform plasma. The constant speed rotation of these spatial processing chambers require the wafers to move into and out of a plasma and therefore some of the wafer is exposed to plasma while other areas are outside of the plasma. Furthermore, it can be difficult to change the exposure times in a spatial processing chamber due to the constant rotation rate. As an example, a process uses a 0.5 sec exposure to gas A followed by a 1.5 sec plasma treatment. Because the tool runs at constant rotational velocity, the only way to do this is to make the plasma environment 3 times bigger than the gas A dosing environment. If another process is to be performed where the gas A and plasma times are equal, a change to the hardware would be needed. The current spatial ALD chambers can only slow down or speed up the rotation speed but cannot adjust for time differences between the steps without changing the chamber hardware for smaller or larger areas. Therefore, there is a need in the art for improved deposition apparatus and methods.

SUMMARY

One or more embodiments of the disclosure are directed to support assemblies comprising a rotatable center base, at least two support arms and heaters. The rotatable center base defines a rotation axis. Each of the support arms extend from the center base and have an inner end in contact with the center base and an outer end. Heaters having a support surface are positioned on the outer end of each of the support arms.

Additional embodiments of the disclosure are directed to processing chambers comprising a housing, a plurality of process stations and a support assembly. The housing has walls, a bottom and a top defining an interior volume. The plurality of process stations are in the interior volume of the housing. The process stations are positioned in a circular arrangement around a rotational axis. Each of the process stations comprises a gas injector having a front face. The front faces of each of the gas injectors are substantially coplanar. The support assembly is in the interior volume of the housing positioned below the plurality of process stations. The support assembly includes a rotatable center base with a plurality of support arms extending from the center base. Each support arm has an inner end in contact with the center base and an outer end. A heater having a support surface is positioned on the outer end of each of the support arms.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
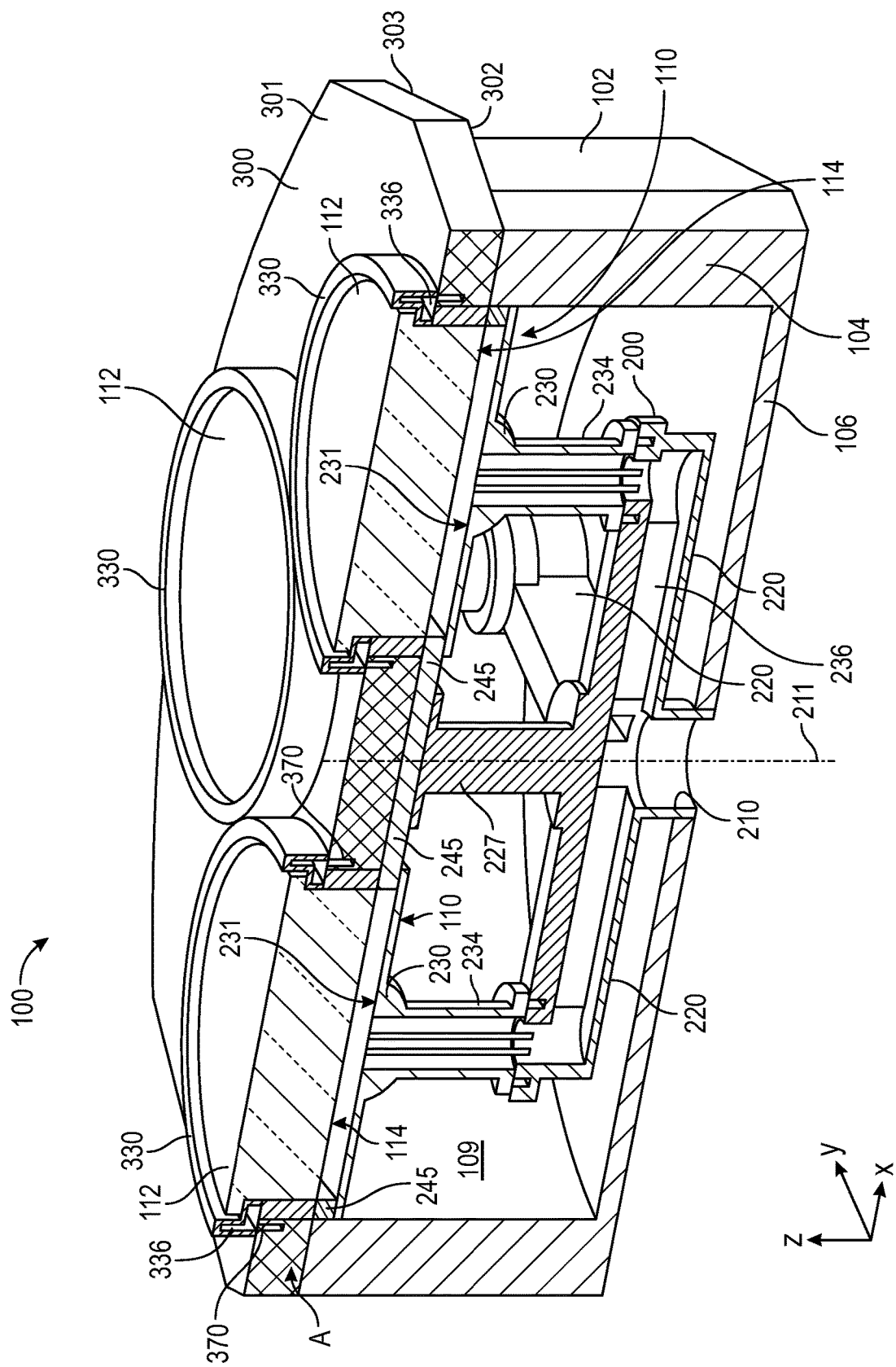
FIG. 1 shows an cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure use spatial separation between two or more processing environments. Some embodiments advantageously provide apparatus and methods to maintain separation of incompatible gases. Some embodiments advantageously provide apparatus and methods including optimizable plasma processing. Some embodiments advantageously provide apparatus and methods that allow for a differentiated thermal dosing environment, a differentiated plasma treatment environment and other environments.

One or more embodiments of the disclosure are directed to processing chambers having four spatially separated processing environments, also referred to as processing stations. Some embodiments have more than four and some embodiments have less than four. The processing environments can be mounted coplanar to the wafer(s) that are moving in a horizontal plane. The process environments are placed in a circular arrangement. A rotatable structure with one to four (or more) individual wafer heaters mounted thereon moves the wafers in a circular path with a diameter similar to the process environments. Each heater may be temperature controlled and may have one or multiple concentric zones. For wafer loading, the rotatable structure could be lowered so that a vacuum robot could pick finished wafers and place unprocessed wafers on lift pins located above each wafer heater (in the lower Z position). In operation, each wafer can be under an independent environment until the process is finished, then rotatable structure can rotate to move the wafers on the heaters to the next environment (90° rotation for four stations, 120° rotation if three stations) for processing.

Some embodiments of the disclosure advantageously provide spatial separation for ALD with incompatible gases. Some embodiments allow for higher throughput and tool resource utilization than a traditional time-domain or spatial process chamber. Each process environment can operate at a different pressure. The heater rotation has Z direction motion so each heater can be sealed into a chamber.

Some embodiments advantageously provide plasma environments that can include one or more of microwave, ICP, parallel plate CCP or 3 electrode CCP. The entire wafer can be immersed in plasma; eliminating the plasma damage from non-uniform plasma across the wafer.

In some embodiments, a small gap between the showerhead and the wafer can be used to increase dose gas utilization and cycle time speed. Precise showerhead temperature control and high operating range (up to 230° C.). Without being bound by theory, it is believed that the closer the showerhead temperature is to the wafer temperature, the better the wafer temperature uniformity.

The showerheads can include small gas holes (<200 μm), a high number of gas holes (many thousands to greater than 10 million) and recursively fed gas distribution inside the showerhead using small distribution volume to increase speed. The small size and high number gas holes can be created by laser drilling or dry etching. When a wafer is close to the showerhead, there is turbulence experienced from the gas going through the vertical holes towards the wafer. Some embodiments allow for a slower velocity gas through the showerhead using a large number of holes spaced close together achieving a uniform distribution to the wafer surface.

Some embodiments are directed to integrated processing platforms using a plurality of spatially separated processing stations (chambers) on a single tool. The processing platform can have a variety of chambers that can perform different processes.

Some embodiments of the disclosure are directed to apparatus and methods to move wafer(s) attached to a wafer heater(s) from one environment to another environment. The rapid movement can be enabled by electrostatically chucking (or clamping) the wafer(s) to the heater(s). The movement of the wafers can be in linear or circular motion.

Some embodiments of the disclosure are directed to methods of processing one or more substrates. Examples include, but are not limited to, running one wafer on one heater to a plurality of different sequential environments spatially separated; running two wafers on two wafer heaters to three environments (two environments the same and one different environment between the two similar environments); wafer one sees environment A then B, and repeats, while wafer two sees B then A and repeats; one environment remaining idle (without wafer); running two wafers in two first environments and two second environments where both wafers see the same environments at the same time (i.e., both wafers in A then both go to B); four wafers with two A and two B environments; and two wafers processing in A's while the other two wafers are processing in B's. In some embodiments, wafers are exposed to environment A and environment B repeatedly, and then exposed to a third environment located in the same chamber.

In some embodiments, wafers go through a plurality of chambers for processing where at least one of the chambers does sequential processing with a plurality of spatially separated environments within the same chamber.

Some embodiments are directed to apparatus with spatially separated processing environments within the same chamber where the environments are at significantly different pressures (e.g., one at <100 mT another at >3T). In some embodiments, the heater rotation robot moves in the z-axis to seal each wafer/heater into the spatially separated environments.

Some embodiments include a structure built above the chamber with a vertical structural member applying a force upward to the center of the chamber lid to eliminate deflection caused by the pressure of atmosphere on the topside and the vacuum on the other side. The magnitude of force of the structure above can be mechanically adjusted based on the deflection of the top plate. The force adjustment can be done automatically using a feedback circuit and force transducer or manually using, for example, a screw that can be turned by an operator.

Figure 2:
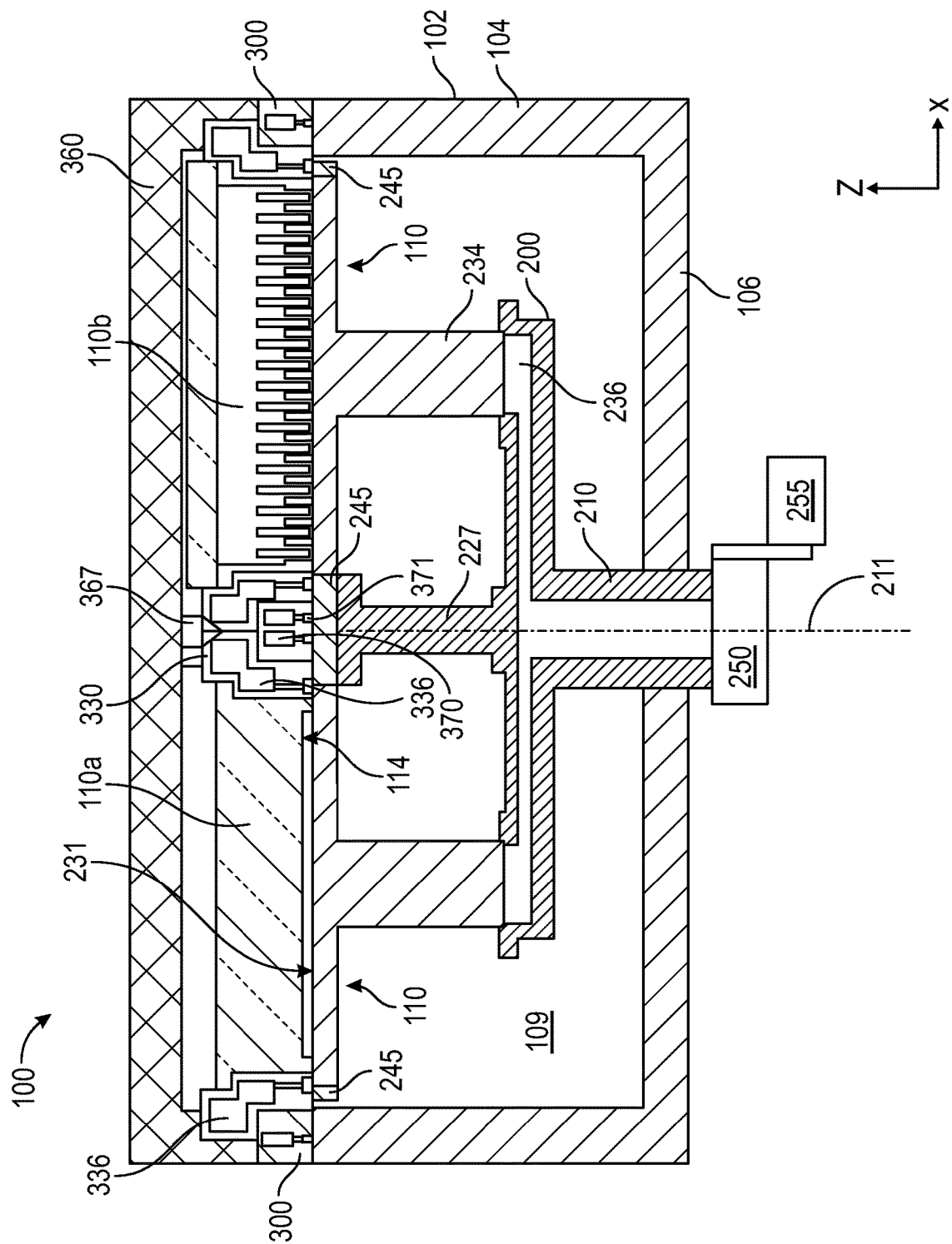
FIG. 2 shows a cross-sectional view of a processing chamber in accordance with one or more embodiment of the disclosure.
Figure 3:
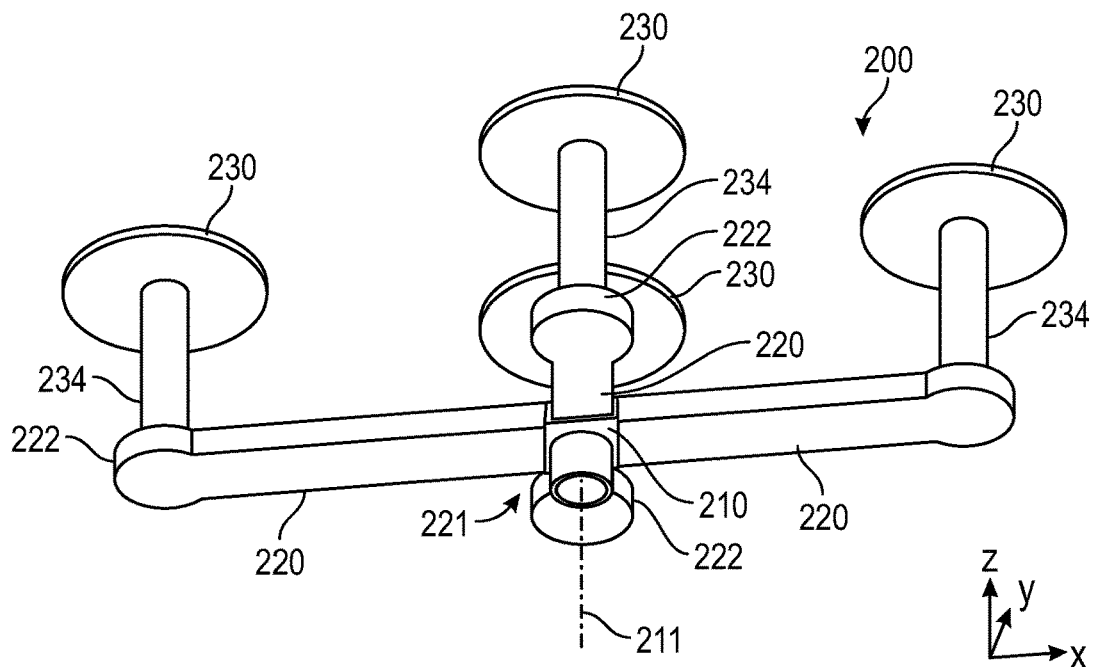
FIG. 3 shows a bottom parallel projection view of a support assembly in accordance with one or more embodiment of the disclosure.

FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a support assembly 200 and top plate 300.

The processing chamber 100 has a housing 102 with walls 104 and a bottom 106. The housing 102 along with the top plate 300 define an interior volume 109, also referred to as a processing volume.

The processing chamber 100 includes a plurality of process stations 110. The process stations 110 are located in the interior volume 109 of the housing 102 and are positioned in a circular arrangement around the rotational axis 211 of the support assembly 200. The process stations 110 are spatially arranged around the interior volume 109 of the processing chamber 100. Each process station 110 comprises a gas injector 112 having a front face 114. In some embodiments, the front faces 114 of each of the gas injectors 112 are substantially coplanar. The process stations 110 are defined as a region in which processing can occur. For example, a process station 110 can be defined by the support surface 231 of the heaters 230, as described below, and the front face 114 of the gas injectors 112.

The process stations 110 can be configured to perform any suitable process and provide any suitable process conditions. The type of gas injector 112 used will depend on, for example, the type of process being performed and the type of showerhead or gas injector. For example, a process station 110 configured to operate as an atomic layer deposition apparatus may have a showerhead or vortex type gas injector. Whereas, a process station 110 configured to operate as a plasma station may have one or more electrode and/or grounded plate configuration to generate a plasma while allowing a plasma gas to flow toward the wafer. The embodiment illustrated in FIG. 2 has a different type of process station 110 on the left side (process station 110a) of the drawing than on the right side (process station 110b) of the drawing. Suitable process stations 110 include, but are not limited to, thermal processing stations, microwave plasma, three-electrode CCP, ICP, parallel plate CCP, UV exposure, laser processing, pumping chambers, annealing stations and metrology stations.

Figure 4:
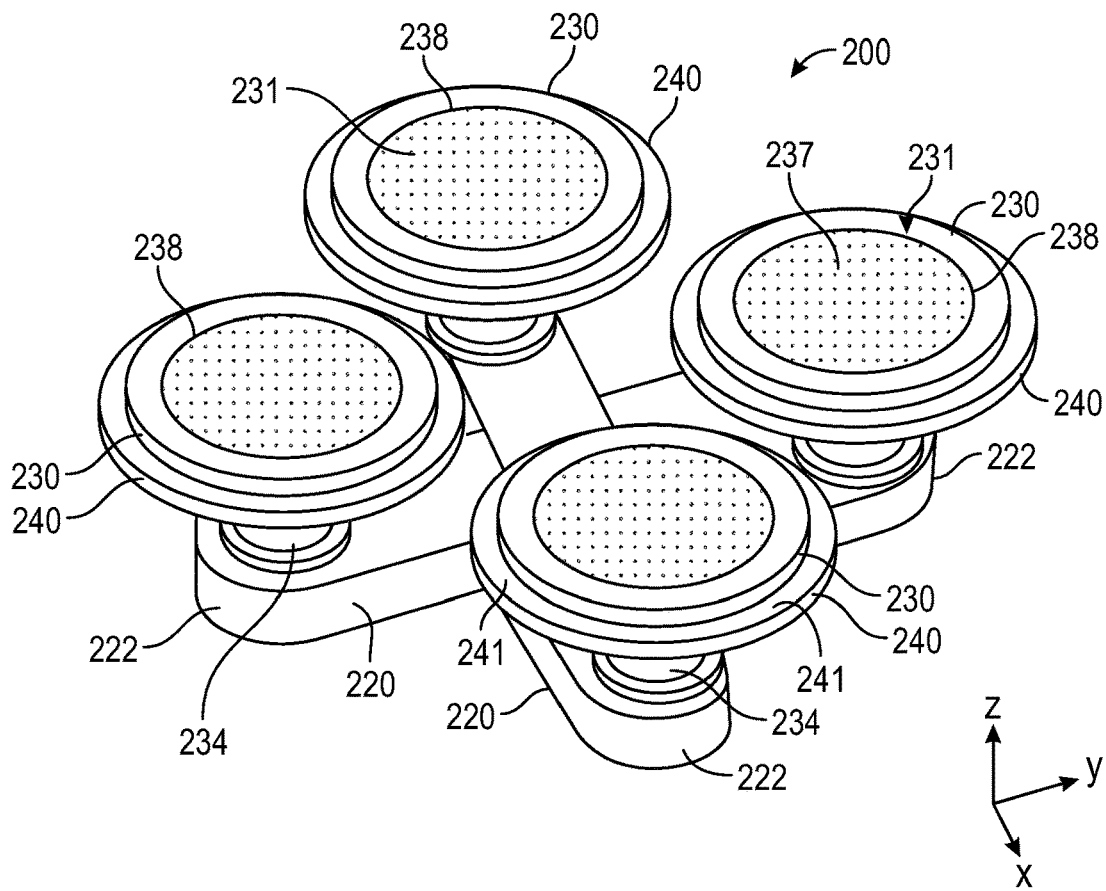
FIG. 4 shows a top parallel projection view of the support assembly in accordance with one or more embodiment of the disclosure.
Figure 5:
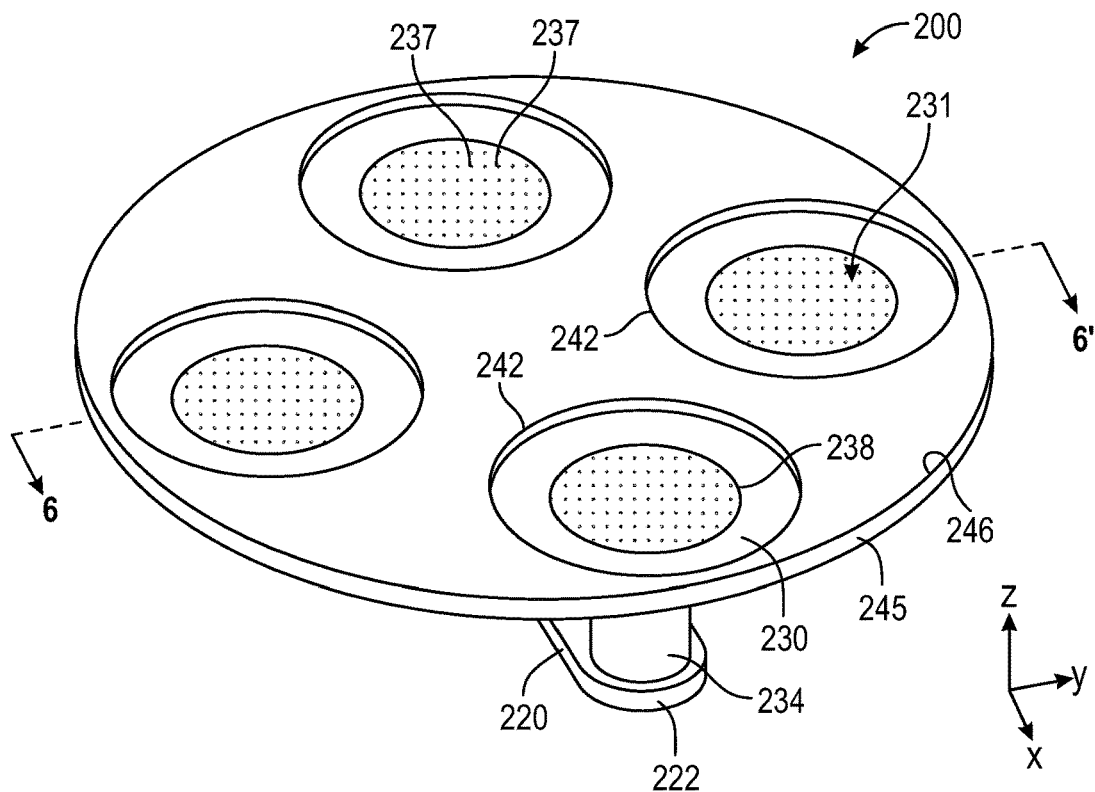
FIG. 5 shows a top parallel projection view of a support assembly in accordance with one or more embodiment of the disclosure.
Figure 6:
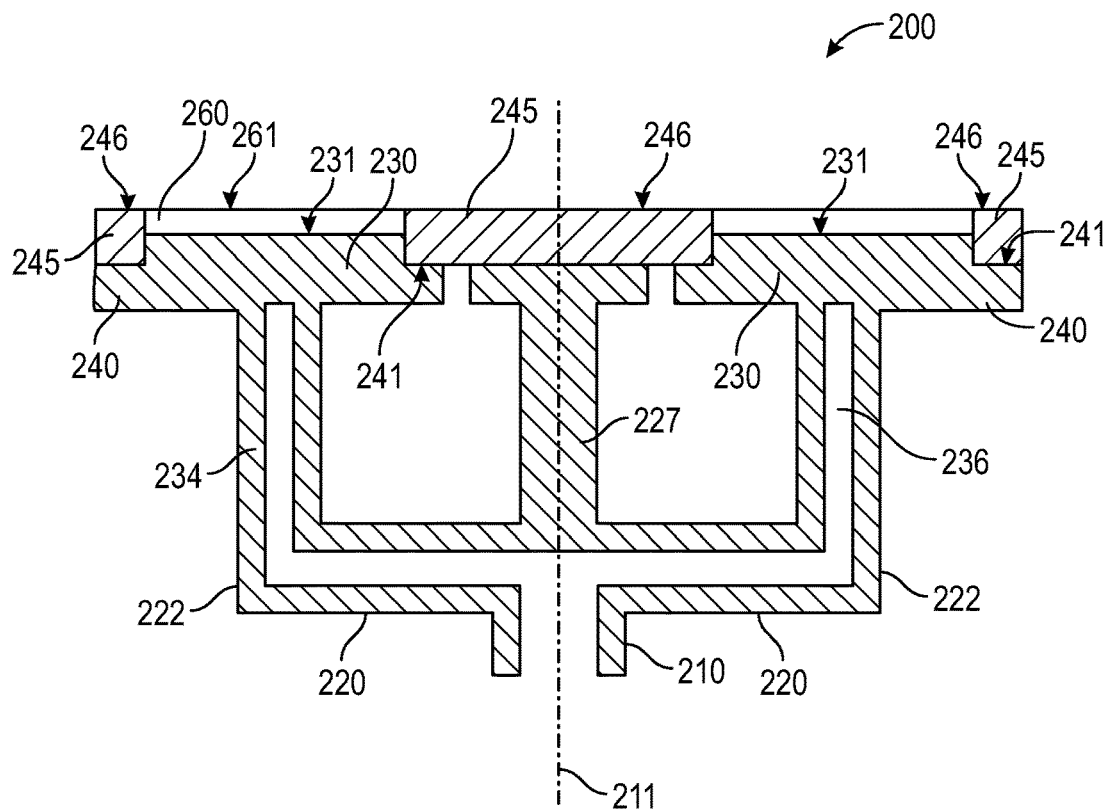
FIG. 6 shows a cross-sectional side view of a support assembly in accordance with one or more embodiment of the disclosure.

FIGS. 3 through 6 illustrate support assemblies 200 in accordance with one or more embodiments of the disclosure. The support assembly 200 includes a rotatable center base 210. The rotatable center base 210 can have a symmetrical or asymmetrical shape and defines a rotational axis 211. The rotational axis 211, as can be seen in FIG. 6, extends in a first direction. The first direction may be referred to as the vertical direction or along the z-axis; however, it will be understood that the use of the term "vertical" in this manner is not limited to a direction parallel to the pull of gravity.

The support assembly 200 includes at least two support arms 220 connected to and extending from the center base 210. The support arms 220 have an inner end 221 and an outer end 222. The inner end 221 is in contact with the center base 210 so that when the center base 210 rotates around the rotational axis 211, the support arms 220 rotate as well. The support arms 220 can be connected to the center base 210 at the inner end 221 by fasteners (e.g., bolts) or by being integrally formed with the center base 210.

In some embodiments, the support arms 220 extend orthogonal to the rotational axis 211 so that one of the inner ends 221 or outer ends 222 are further from the rotational axis 211 than the other of the inner ends 221 and outer ends 222 on the same support arm 220. In some embodiments, the inner end 221 of the support arm 220 is closer to the rotational axis 211 than the outer end 222 of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotation axis 211. In some embodiments, the support assembly 200 has n-number of support arms 220 and the n-number of support arms 220 are arranged to provide n-fold symmetry around the rotation axis 211.

A heater 230 is positioned at the outer end 222 of the support arms 220. In some embodiments, each support arm 220 has a heater 230. The center of the heaters 230 are located at a distance from the rotational axis 211 so that upon rotation of the center base 210 the heaters 230 move in a circular path.

The heaters 230 have a support surface 231 which can support a wafer. In some embodiments, the heater 230 support surfaces 231 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, the heaters 230 are positioned directly on the outer end 222 of the support arms 220. In some embodiments, as illustrated in the drawings, the heaters 230 are elevated above the outer end 222 of the support arms 220 by a heater standoff 234. The heater standoffs 234 can be any size and length to increase the height of the heaters 230.

In some embodiments, a channel 236 is formed in one or more of the center base 210, the support arms 220 and/or the heater standoffs 234. The channel 236 can be used to route electrical connections or to provide a gas flow.

The heaters can be any suitable type of heater known to the skilled artisan. In some embodiments, the heater is a resistive heater with one or more heating elements within a heater body.

Figure 7:
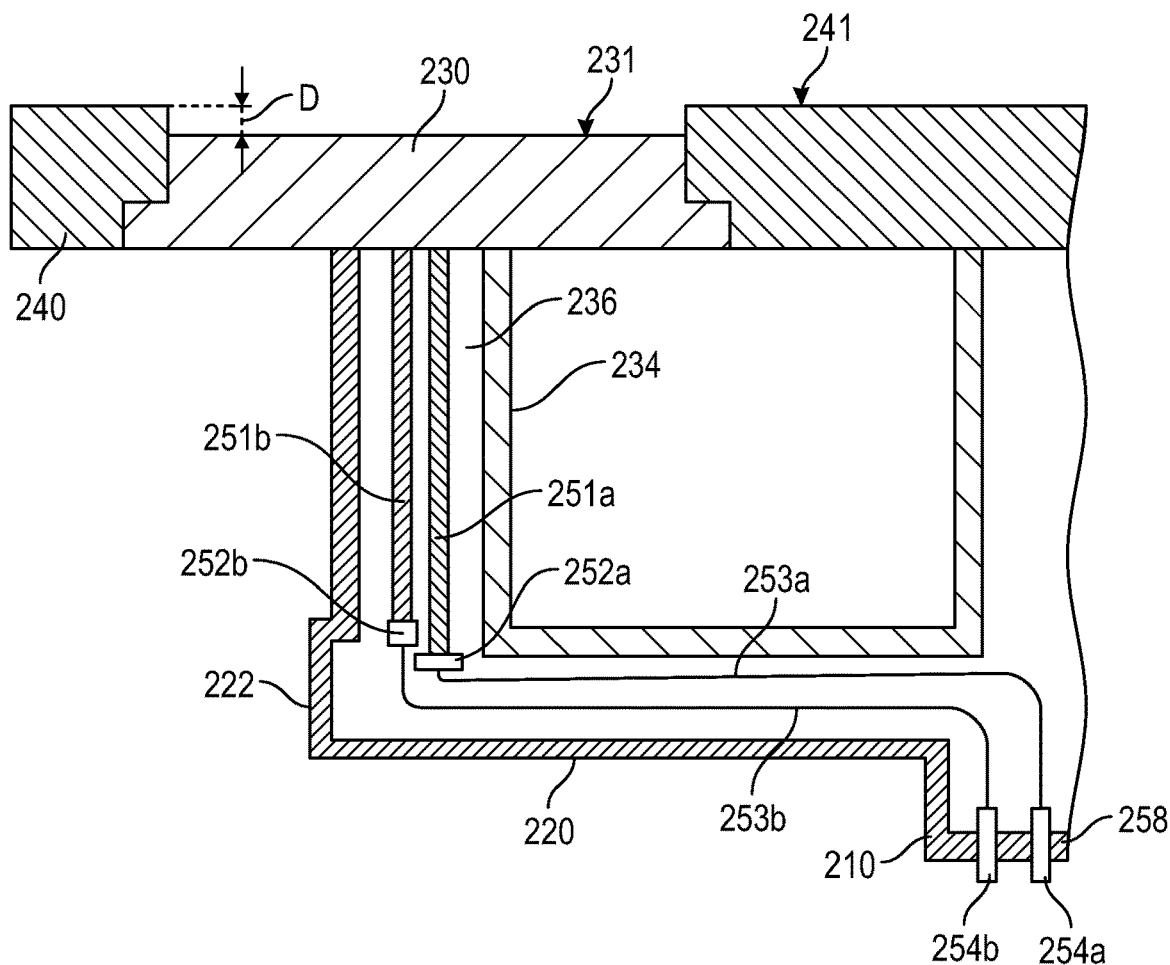
FIG. 7 shows a partial cross-sectional side view of a support assembly in accordance with one or more embodiment of the disclosure.

The heaters 230 of some embodiments include additional components. For example, the heaters may comprise an electrostatic chuck. The electrostatic chuck can include various wires and electrodes so that a wafer positioned on the heater support surface 231 can be held in place while the heater is moved. This allows a wafer to be chucked onto a heater at the beginning of a process and remain in that same position on that same heater while moving to different process regions. In some embodiments, the wires and electrodes are routed through the channels 236 in the support arms 220. FIG. 7 shows an expanded view of a portion of a support assembly 200 in which the channel 236 is shown. The channel 236 extends along the support arm 220 and the heater standoff 234. A first electrode 251a and second electrode 251b are in electrical communication with heater 230, or with a component inside heater 230 (e.g., a resistive wire). First wire 253a connects to first electrode 251a at first connector 252a. Second wire 253b connects to second electrode 251b at second connector 252b.

In some embodiments, a temperature measuring device (e.g., pyrometer, thermistor, thermocouple) is positioned within the channel 236 to measure one or more of the heater 230 temperature or the temperature of a substrate on the heater 230. In some embodiments, the control and/or measurement wires for the temperature measurement device are routed through the channel 236. In some embodiments, one or more temperature measurement devices are positioned within the processing chamber 100 to measure the temperature of the heaters 230 and/or a wafer on the heaters 230. Suitable temperature measurement devices are known to the skilled artisan and include, but are not limited to, optical pyrometers and contact thermocouples.

The wires can be routed through the support arms 220 and the support assembly 200 to connect with a power source (not shown). In some embodiments, the connection to the power source allows continuous rotation of the support assembly 200 without tangling or breaking the wires 253a, 253b. In some embodiments, as shown in FIG. 7, the first wire 253a and second wire 253b extend along the channel 236 of the support arm 220 to the center base 210. In the center base 210 the first wire 253a connects with center first connector 254a and the second wire 253b connects with center second connector 254b. The center connectors 254a, 254b can be part of a connection plate 258 so that power or electronic signals can pass through center connectors 254a, 254b. In the illustrated embodiment, the support assembly 200 can rotate continuously without twisting or breaking wires because the wires terminate in the center base 210. A second connection is on the opposite side of the connection plate 258 (outside of the processing chamber).

In some embodiments, the wires are connected directly to a power source or electrical component outside of the processing chamber through the channel 236. In embodiments of this sort, the wires have sufficient slack to allow the support assembly 200 to be rotated a limited amount without twisting or breaking the wires. In some embodiments, the support assembly 200 is rotated less than or equal to about 1080°, 990°, 720°, 630°, 360° or 270° before the direction of rotation is reversed. This allows the heaters to be rotated through each of the stations without breaking the wires.

Referring again to FIGS. 3 through 6, the heater 230 and support surface 231 can include one or more gas outlets to provide a flow of backside gas. This may assist in the removal of the wafer from the support surface 231. As shown in FIGS. 4 and 5, the support surface 231 includes a plurality of openings 237 and a gas channel 238. The openings 237 and/or gas channel 238 can be in fluid communication with one or more of a vacuum source or a gas source (e.g., a purge gas). In embodiments of this sort, a hollow tube can be included to allow fluid communication of a gas source with the openings 237 and/or gas channel 238.

In some embodiments, the heater 230 and/or support surface 231 are configured as an electrostatic chuck. In embodiments of this sort, the electrodes 251a, 251b (see FIG. 7) can include control lines for the electrostatic chuck.

Some embodiments of the support assembly 200 include a sealing platform 240. The sealing platform has a top surface 241, a bottom surface and a thickness. The sealing platform 240 can be positioned around the heaters 230 to help provide a seal or barrier to minimize gas flowing to a region below the support assembly 200.

In some embodiments, as shown in FIG. 4, the sealing platforms 240 are ring shaped and are positioned around each heater 230. In the illustrated embodiment, the sealing platforms 240 are located below the heater 230 so that the top surface 241 of the sealing platform 240 is below the support surface 231 of the heater.

Figure 8:
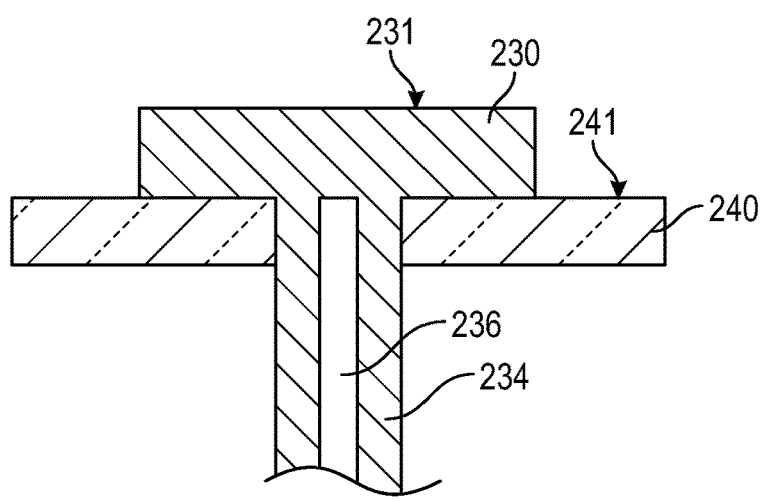
FIG. 8 shows a partial cross-sectional side view of a support assembly in accordance with one or more embodiment of the disclosure.

The sealing platforms 240 can have a number of purposes. For example, the sealing platforms 240 can be used to increase the temperature uniformity of the heater 230 by increasing thermal mass. In some embodiments, the sealing platforms 240 are integrally formed with the heater 230 (see for example FIG. 6). In some embodiments, the sealing platforms 240 are separate from the heater 230. For example, the embodiment illustrated in FIG. 8 has the sealing platform 240 as a separate component connected to the heater standoff 234 so that the top surface 241 of the sealing platform 240 is below the level of the support surface 231 of the heater 230.

In some embodiments, the sealing platforms 240 act as a holder for a support plate 245. In some embodiments, as shown in FIG. 5, the support plate 245 is a single component that surrounds all of the heaters 230 with a plurality of openings 242 to allow access to the support surface 231 of the heaters 230. The openings 242 can allow the heaters 230 to pass through the support plate 245. In some embodiments, the support plate 245 is fixed so that the support plate 245 moves vertically and rotates with the heaters 230.

Figure 20:
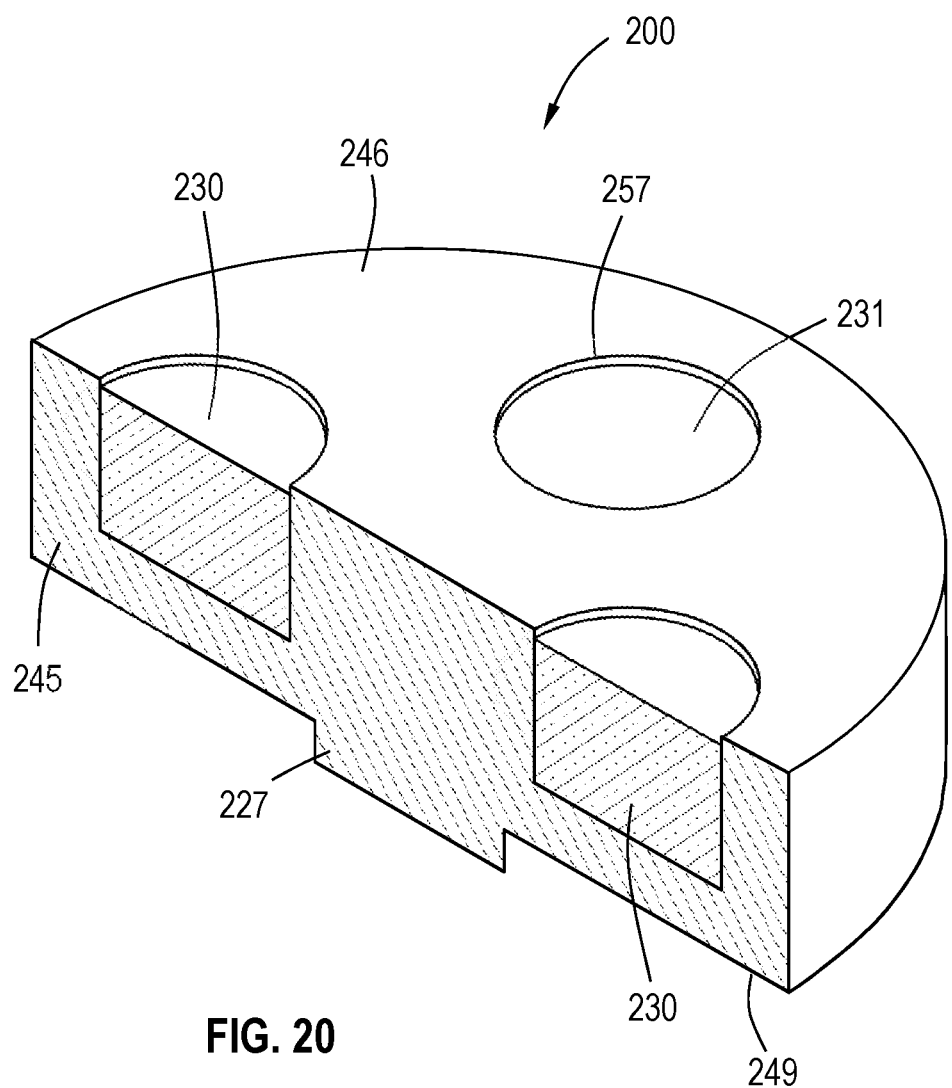
FIG. 20 shows a cross-sectional schematic representation of a support assembly in accordance with one or more embodiment of the disclosure.

In one or more embodiments, the support assembly 200 is a drum shaped component; for example, as shown in FIG. 20, a cylindrical body with a top surface 246 configured to support a plurality of wafers. The top surface 246 of the support assembly 200 an have a plurality of recesses (pockets 257) sized to support one or more wafers during processing. In some embodiments, the pockets 257 have a depth equal to about the thickness of the wafers to be processed so that the top surface of the wafers are substantially coplanar with the top surface 246 of the cylindrical body. An example of such a support assembly 200 can be envisioned as a modification of FIG. 5 without the support arms 220. FIG. 20 illustrates a cross-sectional view of an embodiment of the support assembly 200 using a cylindrical body. The support assembly 200 includes a plurality of pockets 257 sized to support a wafer for processing. In the illustrated embodiment, the bottom of the pockets 257 is the support surface 231 of a heater 230. The power connections for the heaters 230 can be routed through the support post 227 and the support plate 245. The heaters 230 can be independently powered to control the temperature of the individual pockets 257 and wafers.

Figure 9:
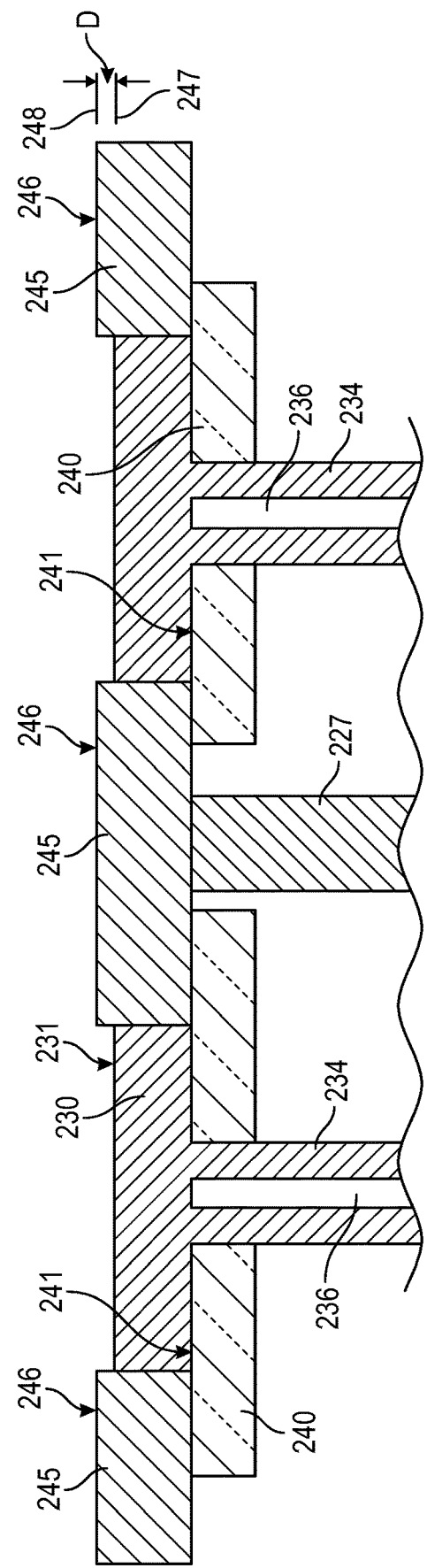
FIG. 9 is a partial cross-sectional side view of a support assembly in accordance with one or more embodiment of the disclosure.

Referring to FIG. 9, in some embodiments, the support plate 245 has a top surface 246 forming a major plane 248 that is substantially parallel with a major plane 247 formed by the support surface 231 of the heater 230. In some embodiments, the support plate 245 has a top surface 246 forming a major plane 248 that is a distance D above the major plane 247 of the support surface 231. In some embodiments, the distance D is substantially equal to the thickness of a wafer 260 to be processed so that the wafer 260 surface 261 is coplanar with the top surface 246 of the support plate 245, as shown in FIG. 6. As used in this manner, the term "substantially coplanar" means that the major plane formed by the surface 261 of the wafer 260 is within ±1 mm, ±0.5 mm, ±0.4 mm, ±0.3 mm, ±0.2 mm or ±0.1 mm of coplanarity.

Referring to FIG. 9, some embodiments of the disclosure have separate components making up the support surfaces for processing. Here, the sealing platform 240 is a separate component than the heater 230 and is positioned so that the top surface 241 of the sealing platform 240 is below the support surface 231 of the heater 230. The distance between the top surface 241 of the sealing platform 240 and the support surface 231 of the heater 230 is sufficient to allow support plate 245 to be positioned on the sealing platforms 240. The thickness of the support plate 245 and/or position of the sealing platform 240 can be controlled so that the distance D between the top surface 246 of the support plate 245 is sufficient so that the top surface 261 of a wafer 260 (see FIG. 6) is substantially coplanar with the top surface 246 of the support plate 245.

In some embodiments, as shown in FIG. 9, the support plate 245 is supported by support post 227. The support post 227 may have utility in preventing sagging of the center of the support plate 245 when a single component platform is used. In some embodiments, there are no sealing platforms 240 and the support post 227 is the primary support for the support plate 245

Figure 10A:
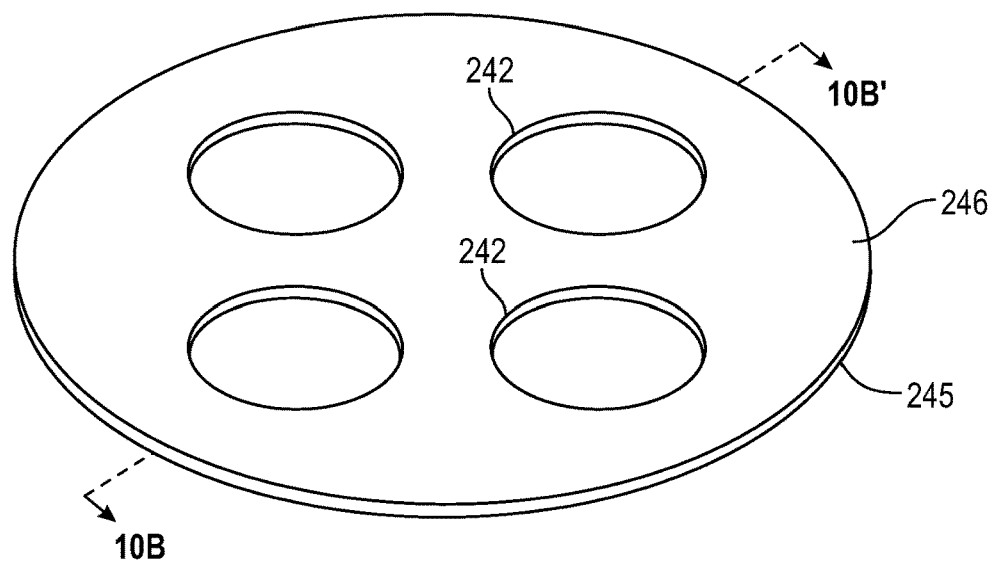
FIG. 10A is a top isometric view of a support plate in accordance with one or more embodiment of the disclosure.
Figure 10B:
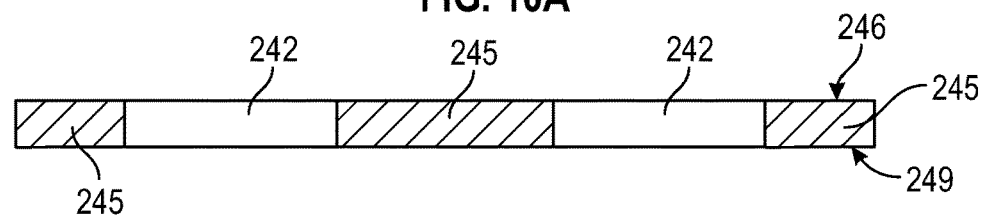
FIG. 10B is a cross-sectional side view of the support plate of FIG. 10A taken along line 10B-10B'.

The support plates 245 can have a variety of configurations to interact with various configurations of heaters 230 and sealing platforms 240. FIG. 10A shows a top isometric view of a support plate 245 in accordance with one or more embodiment of the disclosure. FIG. 10B shows a cross-sectional view of the support plate 245 of FIG. 10A taken along line 10B-10B'. In this embodiment, the support plate 245 is a planar component in which the top surface 246 and bottom surface 249 are substantially flat and/or substantially coplanar. The illustrated embodiment may be particularly useful where a sealing platform 240 is used to support the support plate 245, as shown in FIG. 9.

Figure 11A:
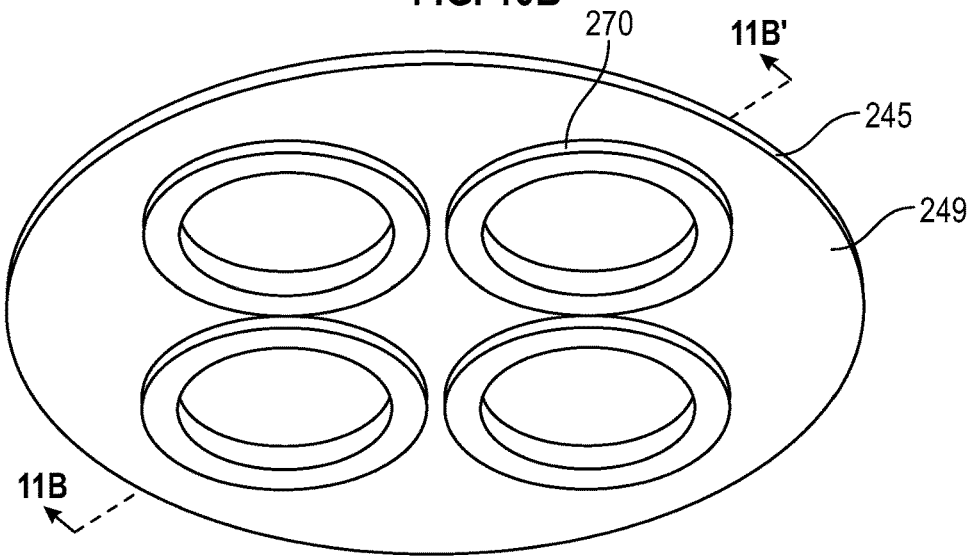
FIG. 11A is a bottom isometric view of a support plate in accordance with one or more embodiment of the disclosure.
Figure 11B:
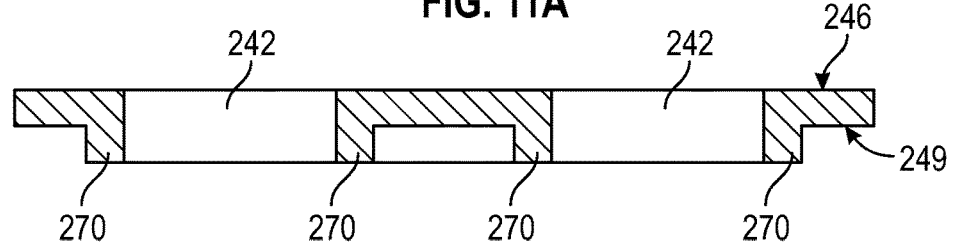
FIG. 11B is a cross-sectional side view of the support plate of FIG. 11A taken along line 11B-11B'.

FIG. 11A shows a bottom isometric view of another embodiment of a support plate 245 in accordance with one or more embodiment of the disclosure. FIG. 11B shows a cross-sectional view of the support plate 245 of FIG. 11A taken along line 11B-11B'. In this embodiment, each of the openings 242 has a protruding ring 270 around the outer periphery of the opening 242 on the bottom surface 249 of the support plate 245.

Figure 12A:
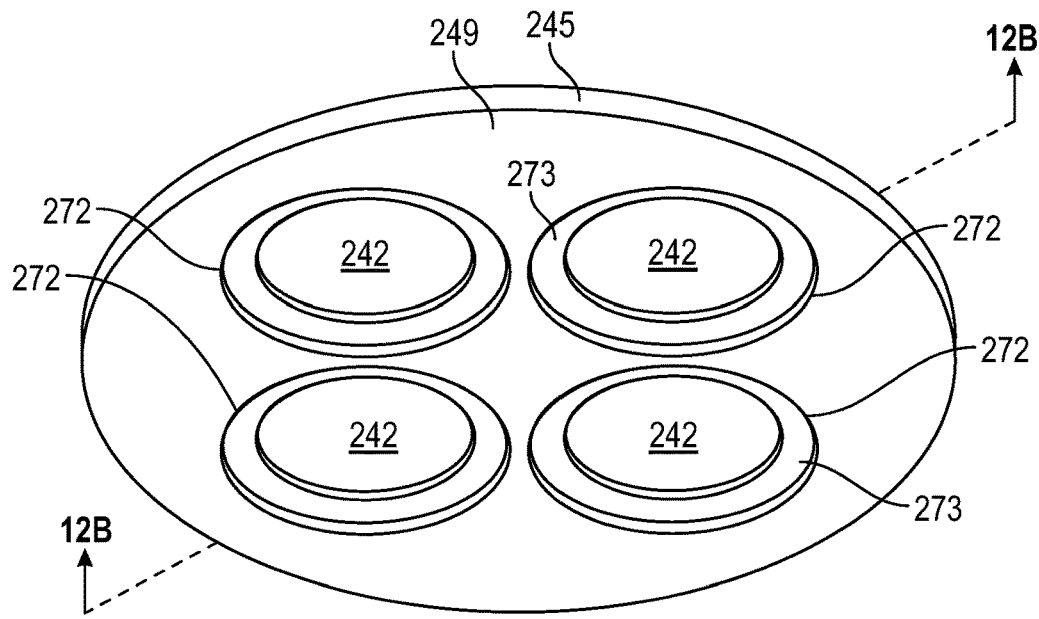
FIG. 12A is a bottom isometric view of a support plate in accordance with one or more embodiment of the disclosure.
Figure 12B:
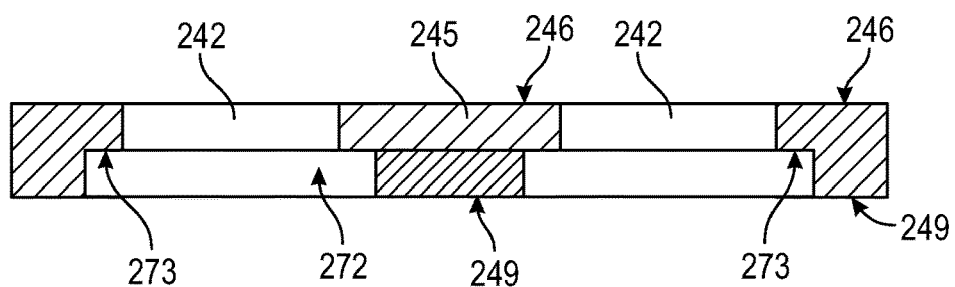
FIG. 12B is a cross-sectional side view of the support plate of FIG. 12A taken along line 12B-12B'.

FIG. 12A shows a bottom isometric view of another embodiment of a support plate 245 in accordance with one or more embodiment of the disclosure. FIG. 12B shows a cross-sectional view of the support plate 245 of FIG. 12A taken along line 12B-12B'. In this embodiment, each of the openings 242 has a recessed ring 272 in the bottom surface 249 of the support plate 245 around the outer periphery of the opening 242. The recessed ring 272 creates a recessed bottom surface 273. Embodiment of this sort may be useful where sealing platforms 240 are either not present or are coplanar with the support surface 231 of the heaters 230. The recessed bottom surface 273 can be positioned on the support surface 231 of the heater 230 so that the bottom portion of the support plate 245 extends below the support surface 231 of the heater 230 around the sides of the heater 230.

Figure 13:
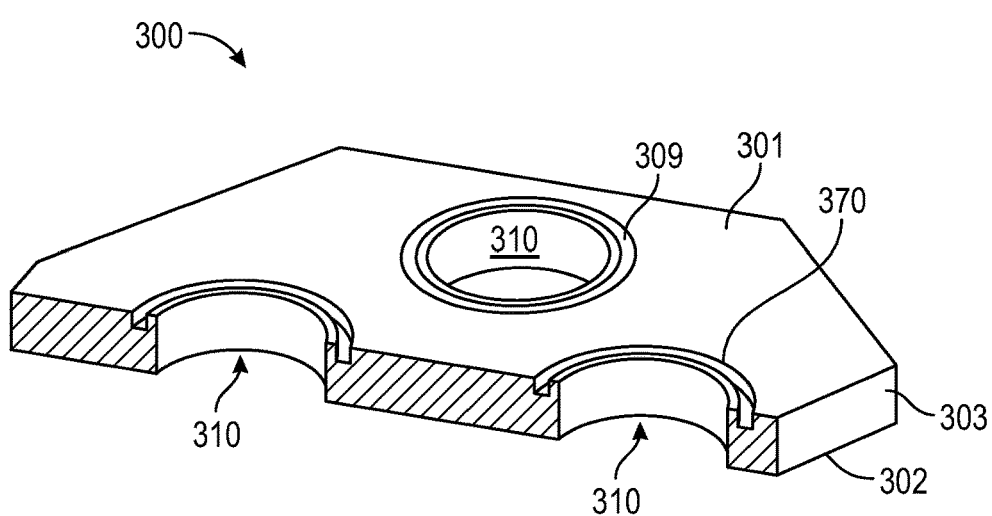
FIG. 13 is a cross-sectional isometric view of a top plate for a processing chamber in accordance with one or more embodiment of the disclosure.

Some embodiments of the disclosure are directed to top plates 300 for multi-station processing chambers. Referring to FIGS. 1 and 13, the top plate 300 has a top surface 301 and a bottom surface 302 defining a thickness of the lid, and one or more edges 303. The top plate 300 includes at least one opening 310 extending through the thickness thereof. The openings 310 are sized to permit the addition of a gas injector 112 which can form a process station 110.

Figure 14:
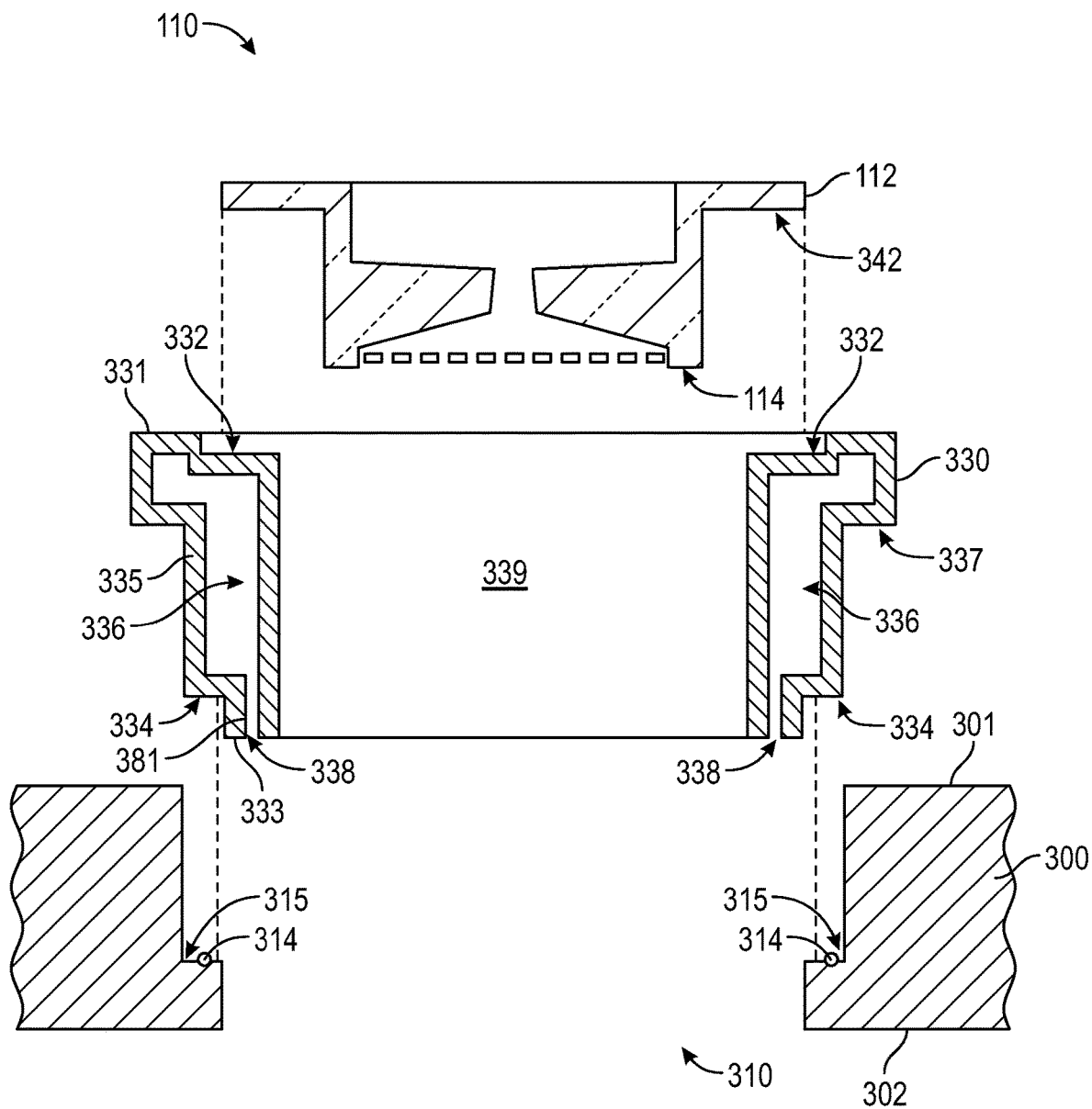
FIG. 14 is an exploded cross-sectional view of a process station in accordance with one or more embodiment of the disclosure.

FIG. 14 illustrates an exploded view of a processing station 110 in accordance with one or more embodiment of the disclosure. The processing station 110 illustrated comprises three main components: the top plate 300 (also called a lid), a pump/purge insert 330 and a gas injector 112. The gas injector 112 shown in FIG. 14 is a showerhead type gas injector. In some embodiments, the insert is connected to or in fluid communication with a vacuum (exhaust). In some embodiments, the insert is connected to or in fluid communication with a purge gas source.

The openings 310 in the top plate 300 can be uniformly sized or have different sizes. Different sized/shape gas injectors 112 can be used with a pump/purge insert 330 that is suitably shaped to transition from the opening 310 to the gas injector 112. For example, as illustrated, the pump/purge insert 330 includes a top 331 and bottom 333 with a sidewall 335. When inserted into the opening 310 in the top plate 300, a ledge 334 adjacent the bottom 333 can be positioned on the shelf 315 formed in the opening 310. In some embodiments, there is no shelf 315 in the opening and a flange portion 337 of the pump/purge insert 330 rests on top of the top plate 300. In the illustrated embodiment, the ledge 334 rests on shelf 315 with an o-ring 314 positioned between to help form a gas-tight seal.

In some embodiments, there are one or more purge rings 309 (see FIG. 13) in the top plate 300. The purge rings 309 can be in fluid communication with a purge gas plenum (not shown) or a purge gas source (not shown) to provide a positive flow of purge gas to prevent leakage of processing gases from the processing chamber.

The pump/purge insert 330 of some embodiments includes a gas plenum 336 with at least one opening 338 in the bottom 333 of the pump/purge insert 330. The gas plenum 336 has an inlet (not shown), typically near the top 331 or sidewall 335 of the pump/purge insert 330.

In some embodiments, the plenum 336 can be charged with a purge or inert gas which can pass through the opening 338 in the bottom 333 of the pump/purge insert 330. The gas flow through the opening 338 can help create a gas curtain type barrier to prevent leakage of process gases from the interior of the processing chamber.

In some embodiments, the plenum 336 is connected to or in fluid communication with a vacuum source. In such an embodiment, gases flow through the opening 338 in the bottom 333 of the pump/purge insert 330 into the plenum 336. The gases can be evacuated from the plenum to exhaust. Such arrange can be used to evacuate gases from the process station 110 during use.

The pump/purge insert 330 includes an opening 339 in which a gas injector 112 can be inserted. The gas injector 112 illustrated has a flange 342 which can be in contact with the ledge 332 adjacent the top 331 of the pump/purge insert 330. The diameter or width of the gas injector 112 can be any suitable size that can fit within the opening 339 of the pump/purge insert 330. This allows gas injectors 112 of various types to be used within the same opening 310 in the top plate 300.

Figure 15:
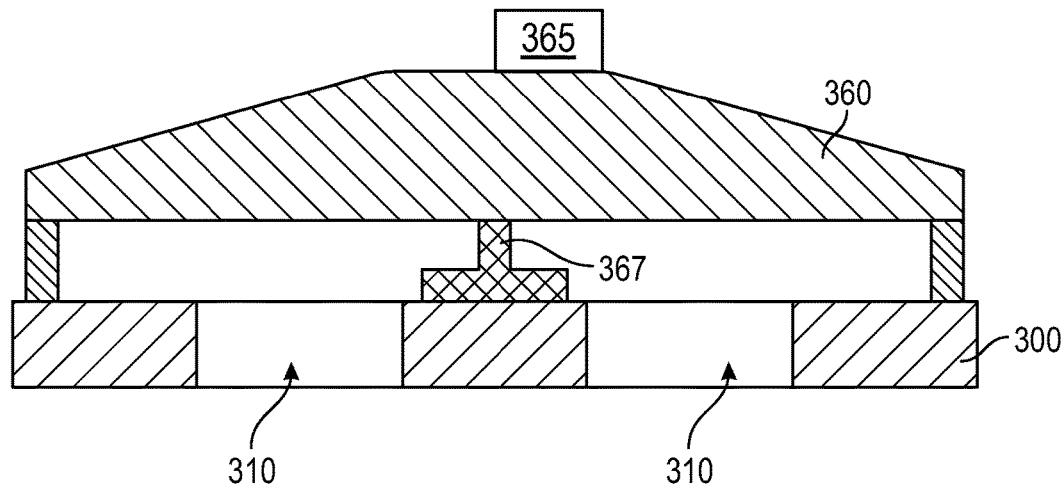
FIG. 15 is a schematic cross-sectional side view of a top plate for a processing chamber in accordance with one or more embodiment of the disclosure.

With reference to FIGS. 2 and 15, some embodiments of the top plate 300 include a bar 360 that passes over a center portion of the top plate 300. The bar 360 can be connected to the top plate 300 near the center using connector 367. The connector 367 can be used to apply force orthogonal to the top 331 or bottom 333 of the top plate 300 to compensate for bowing in the top plate 300 as a result of pressure differentials or due to the weight of the top plate 300. In some embodiments, the bar 360 and connector 367 are capable of compensating for deflection of up to or equal to about 1.5 mm at the center of a top plate having a width of about 1.5 m and a thickness of up to or equal to about 100 mm. In some embodiments, a motor 365 or actuator is connected to connector 367 and can cause a change in directional force applied to the top plate 300. The motor 365 or actuator can be supported on the bar 360. The bar 360 illustrated is in contact with the edges of the top plate 300 at two locations. However, the skilled artisan will recognize that there can be one connection location or more than two connection locations.

In some embodiments, as illustrated in FIG. 2, the support assembly 200 includes at least one motor 250. The at least one motor 250 is connected to the center base 210 and is configured to rotate the support assembly 200 around the rotational axis 211. In some embodiments, the at least one motor is configured to move the center base 210 in a direction along the rotational axis 211. For example, in FIG. 2, motor 255 is connected to motor 250 and can move the support assembly 200 along the rotational axis 211. Stated differently, the motor 255 illustrated can move the support assembly 200 along the z-axis, vertically or orthogonally to the movement caused by motor 250. In some embodiments, as illustrated, there is a first motor 250 to rotate the support assembly 200 around the rotational axis 211 and a second motor 255 to move the support assembly 200 along the rotational axis 211 (i.e., along the z-axis or vertically).

Figure 16:
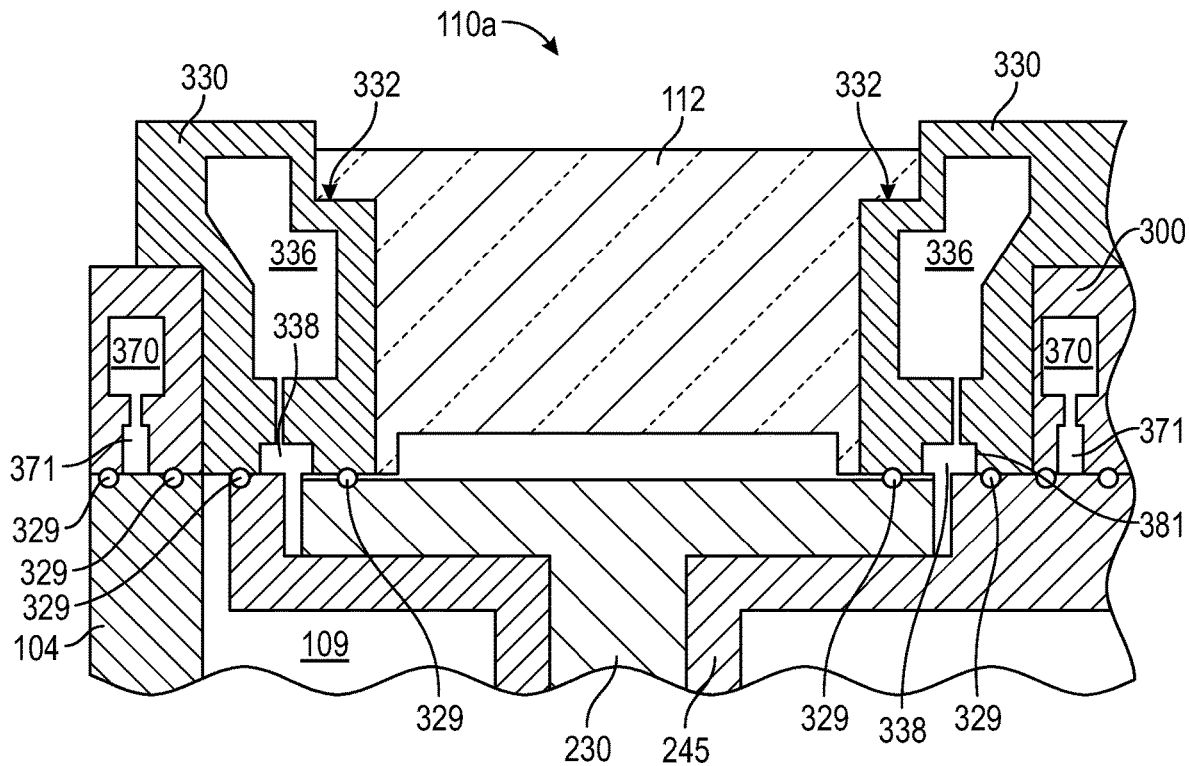
FIG. 16 is a partial cross-sectional side view of a process station in a processing chamber in accordance with one or more embodiment of the disclosure.

Referring to FIGS. 2 and 16, one or more vacuum streams and/or purge gas streams can be used to help isolate one process station 110a from an adjacent process station 110b. A purge gas plenum 370 can be in fluid communication with a purge gas port 371 at the outer boundary of the process stations 110. In the embodiment illustrated in FIG. 16, the purge gas plenum 370 and purge gas port 371 are located in the top plate 300. Plenum 336, shown as part of the pump/purge insert 330, is in fluid communication with opening 338 which acts as a pump/purge gas port. The purge gas port 371 and purge gas plenum 370, as shown in FIG. 13, and the vacuum port (opening 338) can extend around the perimeter of the process station 110 to form a gas curtain. The gas curtain can help minimize or eliminate leakage of process gases into the interior volume 109 of the processing chamber.

In the embodiment illustrated in FIG. 16, differential pumping can be used to help isolate the process station 110. The pump/purge insert 330 is shown in contact with the heater 230 and support plate 245 with o-rings 329. The o-rings 329 are positioned on either side of the opening 338 in fluid communication with the plenum 336. One o-ring 329 is positioned within the circumference of the opening 338 and the other o-ring 329 is position outside the circumference of the opening 338. The combination of o-rings 329 and pump/purge plenum 336 with opening 338 can provide sufficient differential pressure to maintain gas-tight sealing of the process station 110 from the interior volume 109 of the processing chamber 100. In some embodiments, there is one o-ring 329 positioned either inside or outside of the circumference of the opening 338. In some embodiments, there are two o-rings 329 positioned—one inside and one outside of—the circumference of the purge gas port 371 in fluid communication with plenum 370. In some embodiments, there is one o-ring 329 positioned either inside or outside of the circumference of purge gas port 371 in fluid communication with plenum 370.

The boundary of a process station 110 can be considered the region within which a process gas is isolated by the pump/purge insert 330. In some embodiments, the outer boundary of the process station 110 is the outermost edge 381 of the opening 338 in fluid communication with the plenum 336 of the pump/purge insert 330, as shown in FIGS. 14 and 16.

The number of process stations 110 can vary with the number of heaters 230 and support arms 220. In some embodiments, there are an equal number of heaters 230, support arms 220 and process stations 110. In some embodiments, the heaters 230, support arms 220 and process stations 110 are configured to that each of the support surfaces 231 of the heaters 230 can be located adjacent the front faces 214 of different process stations 110 at the same time. Stated differently, each of the heaters is positioned in a process station at the same time.

The spacing of the processing stations 110 around the processing chamber 100 can be varied. In some embodiments, the processing stations 110 are close enough together to minimize space between the stations so that a substrate can be moved rapidly between the process stations 110 while spending a minimum amount of time and transfer distance outside of one of the stations. In some embodiments, the process stations 110 are positioned close enough that a wafer being transported on the support surface 231 of a heater 230 is always within one of the process stations 110.

Figure 17:
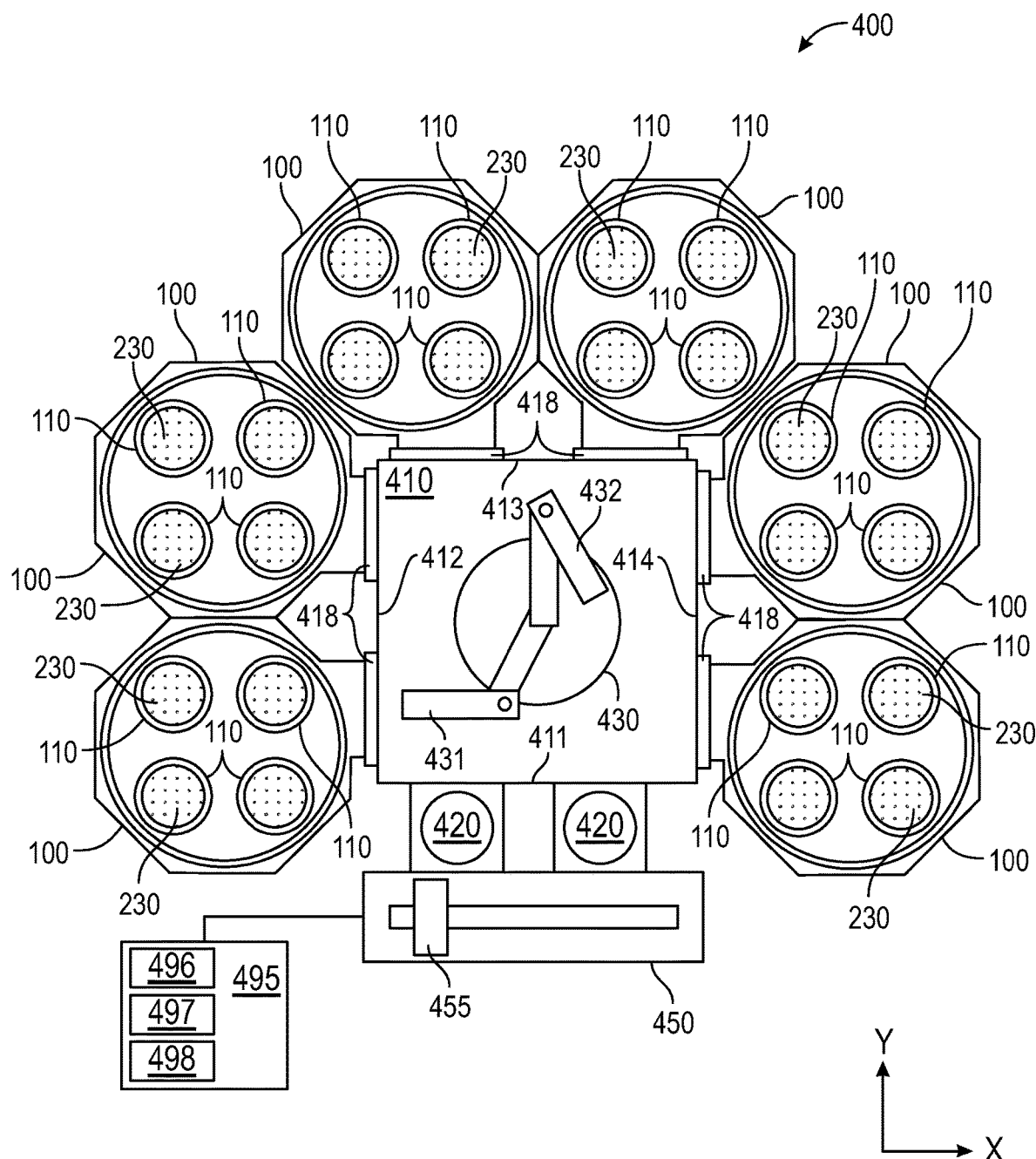
FIG. 17 is a schematic representation of a processing platform in accordance with one or more embodiment of the disclosure.

FIG. 17 shows a processing platform 400 in accordance with one or more embodiment of the disclosure. The embodiment shown in FIG. 17 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 may include separate controllers for each of the individual processing chambers 100, central transfer station 410, factory interface 450 and robots 430.

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

FIGS. 18A through 18I illustrate various configurations of processing chambers 100 with different process stations 110. The lettered circles represent the different process stations 110 and process conditions. For example, in FIG. 18A, there are four process stations 110 each with a different letter. This represents four process stations 110 with each station having different conditions than the other stations. As indicated by the arrow, a process could occur by moving the heaters with wafers from stations A through D. After exposure to D, the cycle can continue or reverse.

Figure 18A:
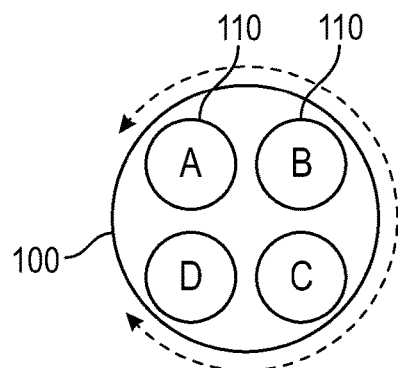
FIGS. 18A through 18I shows schematic views of process station configurations in a processing chamber in accordance with one or more embodiment of the disclosure.
Figure 18B:
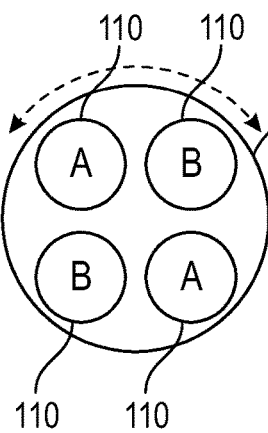

In FIG. 18B, two or four wafers can be processed at the same time with the wafers being moved on the heaters back and forth between the A and B positions. Two wafers could start in the A positions and two wafers in the B positions. The independent process stations 110 allow for the two of the stations to be turned off during the first cycle so that each wafer starts with an A exposure. The heaters and wafers can be rotated continuously either clockwise or counter-clockwise. In some embodiments, the heaters and wafers are rotated 90° in a first direction (e.g., A to B) and then 90° in a second direction (e.g., B back to A). This rotation can be repeated to result in four wafers/heaters being processed without rotating the support assembly by more than about 90°.

The embodiment illustrated in FIG. 18B might also be useful in processing two wafers in the four process stations 110. This might be particularly useful if one of the processes is at a very different pressure or the A and B process times are very different.

Figure 18C:
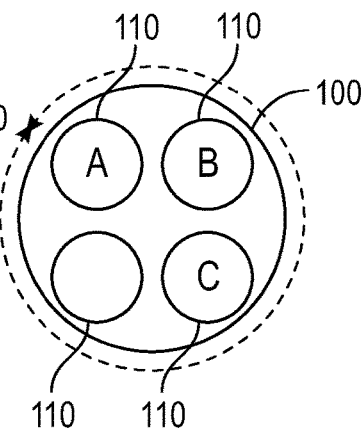

In FIG. 18C, three wafers might be processed in a single processing chamber 100 in and ABC process. One station can either be turned off or perform a different function (e.g., pre-heating).

Figure 18D:
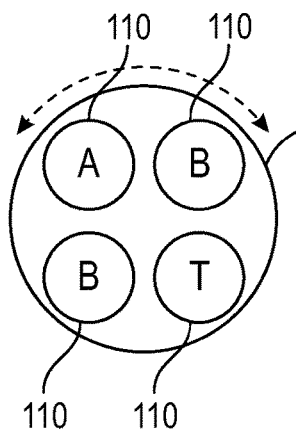

In FIG. 18D, two wafers can be processed in an AB-Treat process. For example, wafers might be placed on the B heaters only. A quarter turn clockwise will place one wafer in the A station and the second wafer in the T station. Turning back will move both wafers to the B stations and another quarter turn counter-clockwise will place the second wafer in the A station and the first wafer in the B station.

Figure 18E:
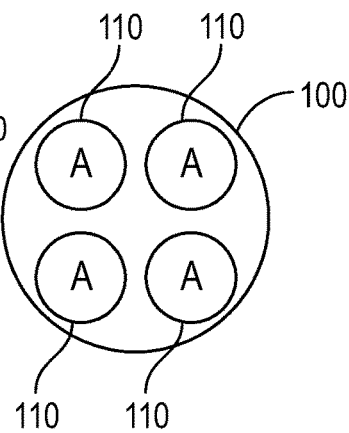
Figure 18F:
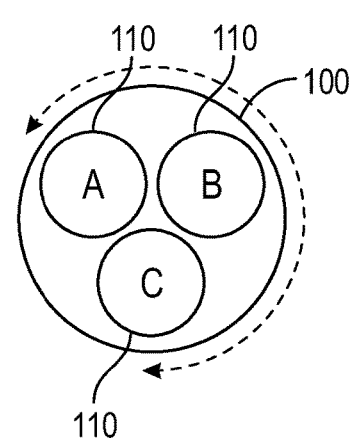

In FIG. 18E, up to four wafers can be processed at the same time. For example, if the A station is configured to perform a CVD or ALD process, four wafers can be processed simultaneously.

Figure 18G:
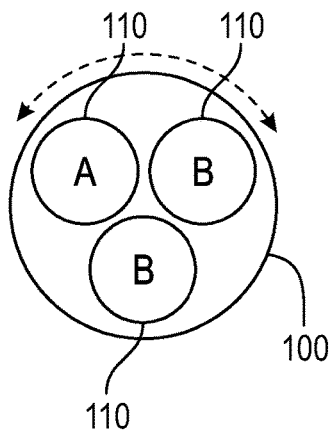
Figure 18H:
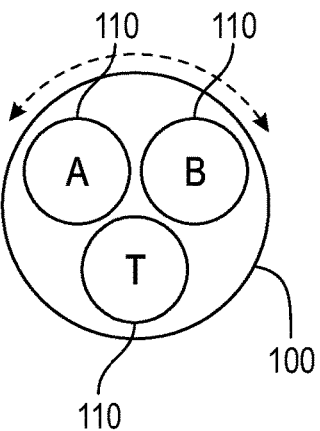
Figure 18I:
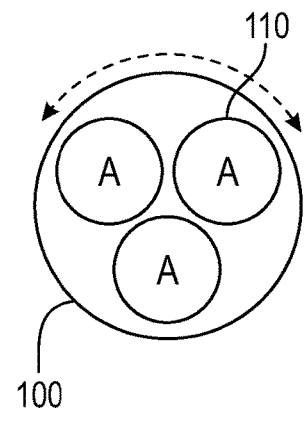

FIGS. 18F through 18I show similar types of configurations for a processing chamber 100 with three process stations 110. Briefly, in FIG. 18F, a single wafer (or more than one) can be subjected to an ABC process. In FIG. 18G, two wafers can be subjected to an AB process by placing one in the A position and the other in one of the B positions. The wafers can then be moved back and forth so that the wafer starting in the B position moves to the A position in the first move and then back to the same B position. In FIG. 18H a wafer can be subjected to an AB-Treat process. In FIG. 18I, three wafers can be processed at the same time.

Figure 19A:
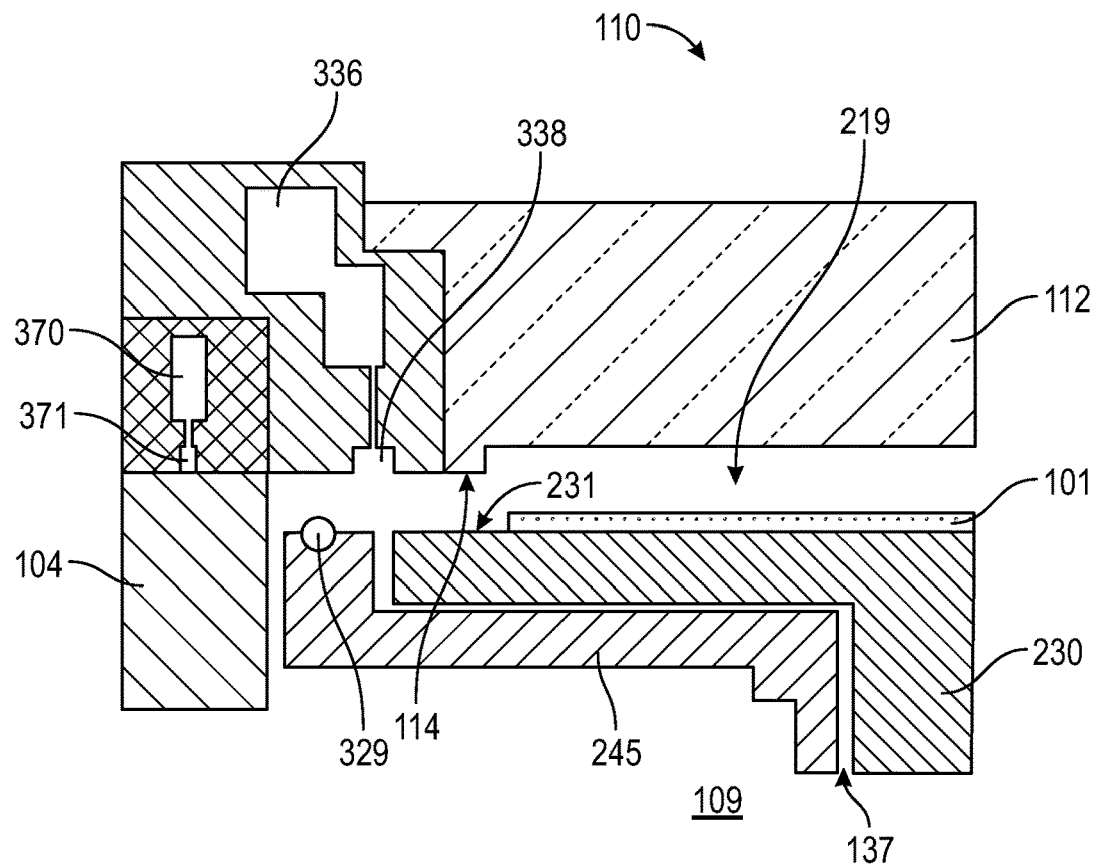
FIGS. 19A and 19B show schematic representations of a process in accordance with one or more embodiment of the disclosure.
Figure 19B:
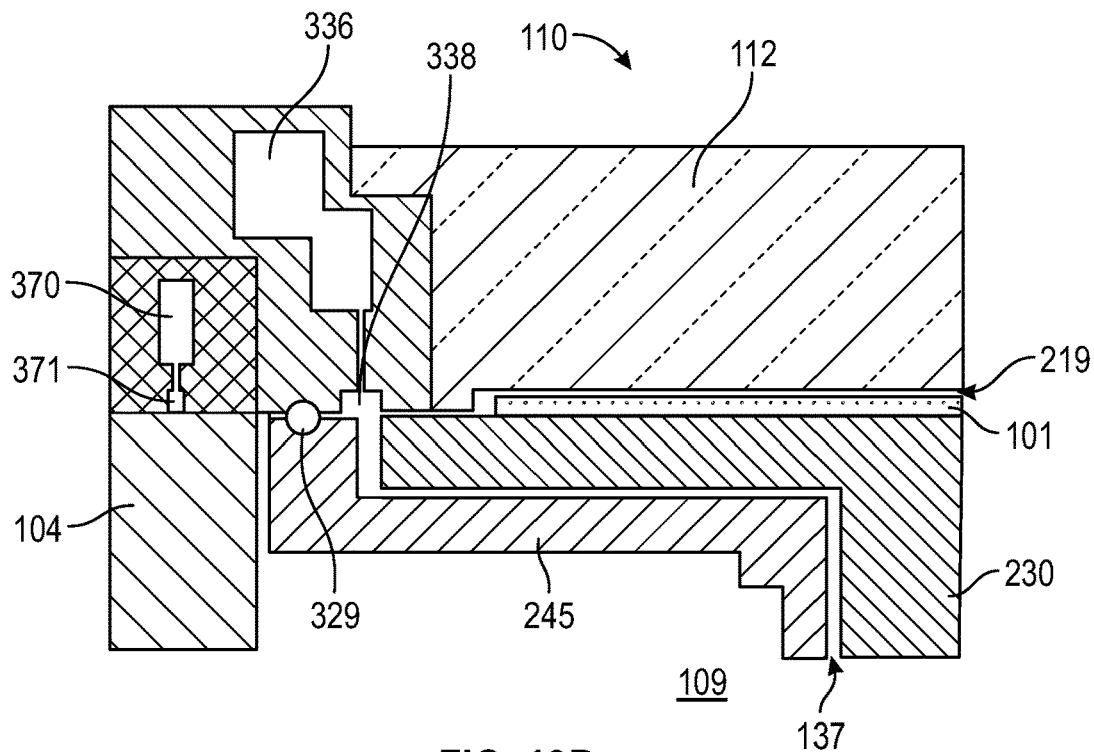

FIGS. 19A and 19B illustrate another embodiment of the disclosure. FIG. 19A shows a partial view of a heater 230 and support plate 245 which has been rotated to a position beneath process station 110 so that wafer 101 is adjacent the gas injector 112. An O-ring 329 on the support plate 245, or on an outer portion of the heater 230, is in a relaxed state.

FIG. 19B shows the support plate 245 and heater 230 after being moved toward the process station 110 so that the support surface 231 of the heater 230 is in contact with or nearly contacts the front face 114 of the gas injector 112 in the process station 110. In this position, O-ring 329 is compressed forming a seal around the outer edge of the support plate 245 or outer portion of the heater 230. This allows the wafer 101 to be moved as close the gas injector 112 as possible to minimize the volume of the reaction region 219 so that the reaction region 219 can be rapidly purged.

Gases which might flow out of the reaction region 219 are evacuated through opening 338 into plenum 336 and to an exhaust or foreline (not shown). A purge gas curtain outside of the opening 338 can be generated by purge gas plenum 370 and purge gas port 371. Additionally, a gap 137 between the heater 230 and the support plate 245 can help to further curtain off the reaction region 219 and prevent reactive gases from flowing into the interior volume 109 of the processing chamber 100.

Referring back to FIG. 17, the controller 495 of some embodiments has one or more configurations selected from: a configuration to move a substrate on the robot between the plurality of processing chambers; a configuration to load and/or unload substrates from the system; a configuration to open/close slit valves; a configuration to provide power to one or more of the heaters; a configuration to measure the temperature of the heaters; a configuration to measure the temperature of the wafers on the heaters; a configuration to load or unload wafers from the heaters; a configuration to provide feedback between temperature measurement and heater power control; a configuration to rotate the support assembly around the rotational axis; a configuration to move the support assembly along the rotational axis (i.e., along the z-axis); a configuration to set or change the rotation speed of the support assembly; a configuration to provide a flow of gas to a gas injector; a configuration to provide power to one or more electrodes to generate a plasma in a gas injector; a configuration to control a power supply for a plasma source;

a configuration to control the frequency and/or power of the plasma source power supply; and/or a configuration to provide control for a thermal anneal treatment station.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A support assembly comprising:
a rotatable center base defining a rotational axis;
at least two support arms extending from the rotatable center base, each of the support arms having an inner end in contact with the center base and an outer end further from the rotational axis than the inner end;
a plurality of heaters, each heater positioned on the outer end of each of the support arms, each of the plurality of heaters having a support surface with a center located a distance from the rotational axis so that upon rotation of the center base the heaters move in a circular path; and
a channel formed in the rotatable center base and the support arms, the channel configured to route electrical connections to the plurality of heaters;
wherein the support surfaces of the heaters are substantially coplanar.

2. The support assembly of claim 1, wherein the support arms extend orthogonal to the rotational axis.

3. The support assembly of claim 1, wherein there are three support arms and three heaters.

4. The support assembly of claim 1, wherein there are four support arms and four heaters.

5. The support assembly of claim 1, wherein the heaters comprise an electrostatic chuck.

6. The support assembly of claim 1, further comprising at least one motor connected to the center base, the at least one motor configured to rotate the support assembly around the rotational axis.

7. The support assembly of claim 6, wherein the at least one motor is configured to move the center base in a direction along the rotational axis.

8. The support assembly of claim 1, further comprising at least one sealing platform around the plurality of heaters, at least one sealing platform having a top surface forming a major plane that is substantially parallel with a major plane formed by the support surface of the plurality of heater.

9. The support assembly of claim 8, wherein there is a plurality of sealing platforms and each of the plurality of heaters has a sealing platform positioned around the heater, each of the sealing platforms forming a ring shaped top surface.

10. The support assembly of claim 8, further comprising a support plate having a plurality of openings, each of the plurality of openings surrounding a support surface of one of the plurality of heaters.

11. A support assembly comprising:
a rotatable center base defining a rotational axis;
at least two support arms extending from the center base orthogonal to the rotational axis, each of the support arms having an inner end in contact with the center base and an outer end;
a heater positioned on the outer end of each of the support arms, each of the heaters having a support surface configured to support a substrate during processing and each of the support surfaces are substantially coplanar, the heaters comprising an electrostatic chuck, each heater having a ring shaped sealing platform positioned around the heater, the sealing platforms having a top surface forming a plane that is substantially parallel with a plane formed by the support surface of the heaters;
a channel formed in the rotatable center base and the support arms, the channel configured to route electrical connections to the plurality of heaters;
a first motor connected to the rotatable center base to rotate the rotatable center base, support arms and heaters around the rotational axis; and
a second motor connected to the rotatable center base to move the rotatable center base, support arms and heaters in a direction along the rotational axis.

12. A processing chamber comprising:
a housing having walls, a bottom and a top defining an interior volume;
a plurality of process stations in the interior volume of the housing, the process stations positioned in a circular arrangement around a rotational axis, each process station comprising a gas injector having a front face, the front face of each of the gas injectors being substantially coplanar; and
a support assembly in the interior volume of the housing, the support assembly positioned below the plurality of process stations, the support assembly including a rotatable center base with a plurality of support arms extending from the center base, each support arm having an inner end in contact with the center base and an outer end, a heater is positioned on the outer end of each of the support arms so that upon rotation of the center base the heaters move in a circular path, the heaters having a support surface configured to support a substrate during processing, and a channel is formed in the rotatable center base and the support arms, the channel configured to route electrical connections to the heater;
wherein the support surfaces of the heaters are substantially coplanar.

13. The processing chamber of claim 12, wherein the support arms extend orthogonal to the rotational axis.

14. The processing chamber of claim 12, wherein there are an equal number of heaters, support arms and process stations configured so that each of the support surfaces of the heaters can be located adjacent the front face of a different process station at the same time.

15. The processing chamber of claim 12, wherein the heaters comprise an electrostatic chuck.

16. The processing chamber of claim 12, further comprising at least one motor connected to the center base, the at least one motor configured to rotate the support assembly around the rotational axis.

17. The processing chamber of claim 12, wherein each heater further comprises a sealing platform positioned around the heater, the sealing platform having a top surface forming a major plane that is substantially parallel with a major plane formed by the support surface of the heater.

* * * * *